United States Patent
Chen

(10) Patent No.: US 9,484,346 B2
(45) Date of Patent: Nov. 1, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Huang-Kui Chen, Hsinchu (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 0 days.

(21) Appl. No.: 14/514,874

(22) Filed: Oct. 15, 2014

(65) Prior Publication Data

US 2016/0111425 A1    Apr. 21, 2016

(51) Int. Cl.
| | | |
|---|---|---|
| H01L 27/14 | (2006.01) | |
| H01L 21/3205 | (2006.01) | |
| H01L 21/70 | (2006.01) | |
| H01L 27/088 | (2006.01) | |
| H01L 27/092 | (2006.01) | |
| H01L 21/8238 | (2006.01) | |
| H01L 29/66 | (2006.01) | |

(Continued)

(52) U.S. Cl.
CPC ... *H01L 27/0922* (2013.01); *H01L 21/823807* (2013.01); *H01L 21/823814* (2013.01); *H01L 21/823821* (2013.01); *H01L 21/823842* (2013.01); *H01L 21/823864* (2013.01); *H01L 27/0924* (2013.01); *H01L 29/66545* (2013.01); *H01L 29/7843* (2013.01); *H01L 29/4966* (2013.01); *H01L 29/517* (2013.01)

(58) Field of Classification Search
CPC .............. H01L 21/823864; H01L 21/823482; H01L 29/4966; H01L 27/0922; H01L 27/0924

USPC .................. 438/592, 586; 257/369, 401, 414
See application file for complete search history.

(56) References Cited

U.S. PATENT DOCUMENTS

| 7,151,023 B1 | 12/2006 | Nayfeh et al. |
| 8,507,979 B1 | 8/2013 | Huang et al. |

(Continued)

FOREIGN PATENT DOCUMENTS

| KR | 10-2006-0026789 | 3/2006 |
| KR | 10-2008-0032220 | 4/2008 |
| KR | 10-2014-0016792 | 2/2014 |

OTHER PUBLICATIONS

Office action issued by KIPO dated Mar. 14, 2016 for corresponding Korean application 9-5-2016-018955012.

(Continued)

*Primary Examiner* — Long K Tran
(74) *Attorney, Agent, or Firm* — WPAT, P.C., Intellectual Property Attorneys; Anthony King

(57) ABSTRACT

The present disclosure provides a semiconductor structure includes a semiconductor layer having a first and a second surface, and an interlayer dielectric (ILD) defining a first metal gate and a second metal gate over the first and second surface, respectively. The first and second metal gate include a first SAC hard mask and a second SAC hard mask, respectively, wherein the first the second SAC hard mask have opposite stress to channel regions underneath the first and second metal gate, respectively. The present disclosure provides a method for manufacturing a semiconductor structure. The method includes forming metal gate recesses, forming metal gates and SAC hard masks in the metal gate recesses, respectively.

19 Claims, 23 Drawing Sheets

(51) Int. Cl.
  *H01L 29/78*   (2006.01)
  *H01L 29/49*   (2006.01)
  *H01L 29/51*   (2006.01)

(56) References Cited

U.S. PATENT DOCUMENTS

| | | | |
|---|---|---|---|
| 2006/0091436 A1 | 5/2006 | Kim et al. | |
| 2011/0079829 A1* | 4/2011 | Lai | H01L 29/785 257/288 |
| 2012/0098070 A1* | 4/2012 | Wang | H01L 21/76834 257/368 |
| 2012/0299160 A1* | 11/2012 | Baars | H01L 21/823807 257/629 |
| 2013/0075827 A1* | 3/2013 | Lee | H01L 29/4966 257/369 |
| 2015/0041905 A1* | 2/2015 | Xie | H01L 29/6656 257/369 |

OTHER PUBLICATIONS

English translation of the Office action issued by KIPO dated Mar. 14, 2016 for corresponding Korean application 9-5-2016-018955012.
U.S. Pat. No. 7,151,023 corresponds to KR20080032220.
U.S. Pat. No. 8,507,979 corresponds to KR20140016792.
US20060091436 corresponds to KR20060026789.

* cited by examiner

SEMICONDUCTOR STRUCTURE AND MANUFACTURING METHOD THEREOF

FIELD

The disclosure relates to a semiconductor structure.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each NFET, PFET, N-FinFET and P-FinFET formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the present disclosure, a semiconductor structure having different stressed NMOS and PMOS and a method to manufacture the same is discussed.

Figure 1:
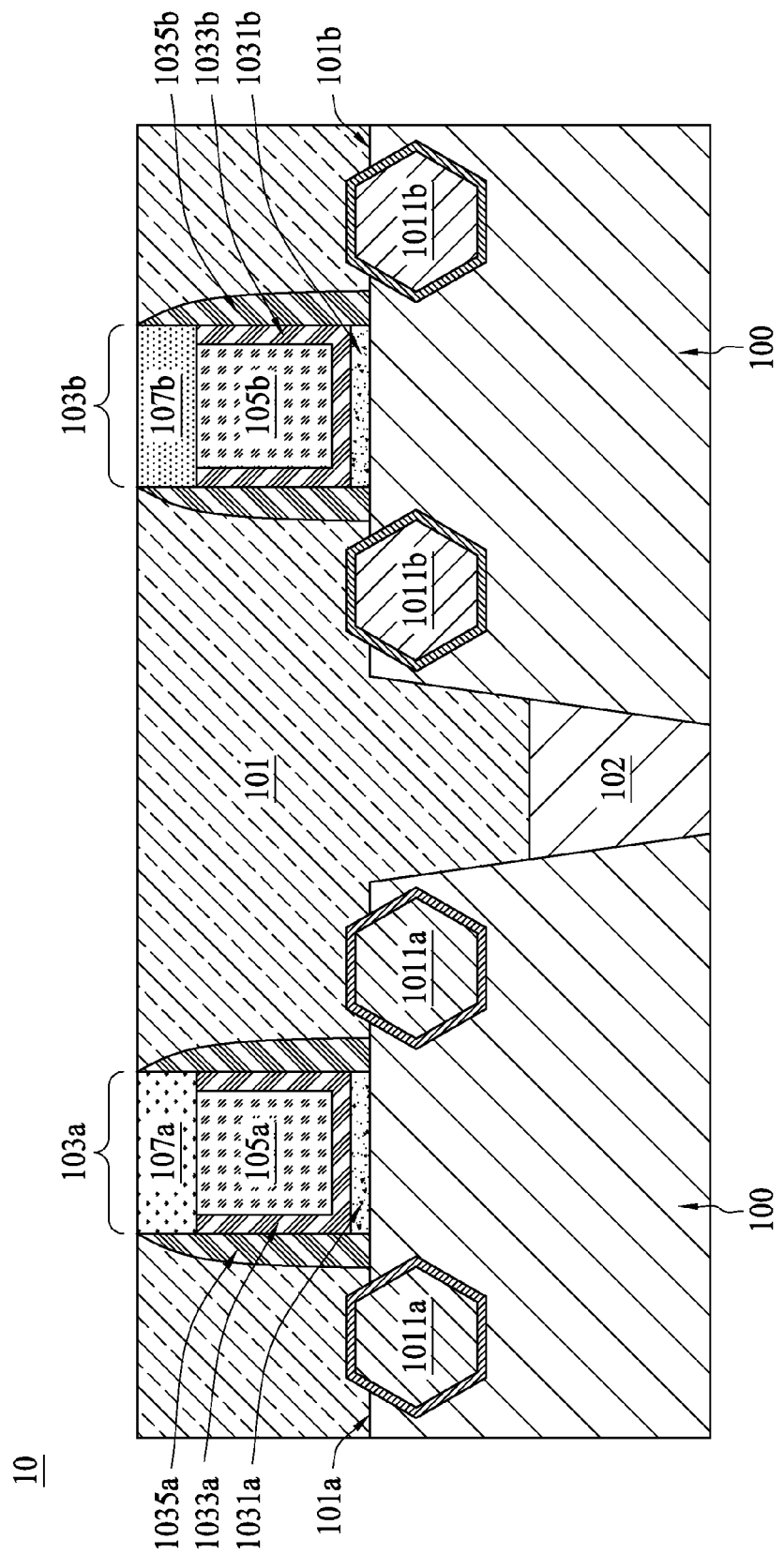
FIG. 1 is a cross sectional view of a semiconductor structure with metal gates and hard masks in accordance with some embodiments of the present disclosure.

FIG. 1 shows a cross sectional view of a semiconductor structure 10 with a first metal gate 103a and a second metal gate 103b, wherein conductive type for the first metal gate 103a is different from the second metal gate 103b. For example, if the first metal gate 103a is a P-type gate, then the second metal gate 103b is N-type. The semiconductor structure 10 has a semiconductor layer 100, where an interlayer dielectric layer (ILD) 101 is positioned over. The ILD 101 also defines and surrounds the first and second metal gate 103a and 103b.

Still referring to FIG. 1, the first metal gate 103a and the second metal gate 103b is separated. In some embodiments as in FIG. 1, an STI (Shallow Trench Isolation) region 102 is in the semiconductor layer 100 and located between the first metal gate 103a and the second metal gate 103b. The semiconductor layer 100 has a first surface 101a that is proximal to a channel region under the first metal gate 103a and a second surface 101b that is proximal to a channel region under the second metal gate 103b. A first source/drain region 1011a is in the semiconductor substrate, and the first source/drain region 1011a is adjacent to a channel region under the first metal gate 103a. A second source/drain region 1011b in the semiconductor substrate, and the second source/drain region 1011b is adjacent to a channel region under the first metal gate 103a. A first SAC hard mask 107a is on top of the first metal gate 103a, and a second SAC hard mask 107b is on top the second metal gate 103b.

In FIG. 1, a first spacer 1035a is disposed between the ILD 101 and the first metal gate 103a. A second spacer 1035b is disposed between the ILD 101 and the second metal gate 103b. The first metal gate 103a, the first spacer 1035a and the ILD 101 are positioned over the first surface 101a of the semiconductor layer 100. The second metal gate 103b, the second spacer 1035b and the ILD 101 are positioned over the second surface 101b of the semiconductor layer 100.

A first high-k dielectric layer 1033a contacts a bottom of the first metal gate 103a and a sidewall of the first spacer 1035a, and a second high-k dielectric layer 1033b contacts a bottom of the second metal gate 103b and a sidewall of the second spacer 1035b. The first metal gate 103a includes a first metal layer 105a contacting the first high-k dielectric layer 1033a. And similar to the first metal gate 103a, the second metal gate 103b includes a second metal layer 105b contacting the second high-k dielectric layer 1033b. However, a conductive type for the first metal 103a may be different from the second metal 103b. For example, if the first metal layer 103a is a P-type gate, then the second metal layer 103b is an N-type gate.

In some embodiments of the present disclosure, the semiconductor substrate 100 referred herein is a bulk semiconductor substrate on which various layers and device structure are formed. In some embodiments, the bulk substrate includes silicon or a compound semiconductor, such as GaAs, InP, Si/Ge, or SiC. Various layers can be formed on the semiconductor substrate 100. For example, dielectric layers, doped layers, polysilicon layers or conductive layers. Various devices can be formed on the semiconductor substrate 101. For example, transistors, resistors, and/or capacitors, which may be interconnected through an interconnect layer to additional integrated circuits.

Still referring to FIG. 1, a sidewall portion of the first metal gate 103a is surrounded by the first spacer 1035a, and a bottom portion of the metal gate 103a is positioned over the first surface 101a. In some embodiments, the metal gate 103a includes an optional interlayer 1031a between a horizontal portion of the first high-k dielectric layer 1033a and the first surface 101a. A sidewall portion of the second metal gate 103b is surrounded by the second spacer 1035b, and a bottom portion of the metal gate 103b is positioned over the second surface 101b. And similar to metal gate 103a, the metal gate 103b also includes an optional interlayer 1031b between a horizontal portion of the second high-k dielectric layer 1033b and the second surface 101b.

The first SAC hard mask 107a and the second SAC hard mask 107b can be configured with different characteristic properties in order to improve performance of transistors. For example, when the first metal gate 103a is an N type gate, it is preferred to have a tensile stress introduced into the channel region underneath the first gate 103a in order to elevate the carrier mobility. Oppositely, since the second metal gate 103b is in P type, it is preferred to have a compressive stress introduced into the channel region underneath the second gate 103b in order to elevate the carrier mobility.

In the present disclosure, there are various approaches to respectively adjust the stress introduced to the channel regions underneath the metal gates 103a and 103b through configuring the film properties of the SAC hard mask for different metal gate. For example, the first SAC hard mask 107a and the second SAC hard mask 107b can be formed into different shapes, or by different process conditions, such as different pressure, plasma density, or RF power during the formation of the SAC hard mask. Details of the embodiments and manufacturing methods thereof will be presented later. In some embodiments, the ILD 101 includes a dielectric material. For example, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD 101 includes a high density plasma (HDP) dielectric material (e.g., HDP oxide) and/or a high aspect ratio process (HARP) dielectric material (e.g., HARP oxide). It is understood that the ILD 101 may include one or more dielectric materials and/or one or more dielectric layers. The ILD 101 is planarized by a chemical-mechanical-polishing (CMP) process until a top portion of the first metal gate 103a and the second metal gate 103b are exposed as illustrated in FIG. 1. The CMP process includes a high selectivity to provide a substantially planar surface for the first metal gate 103a and the second metal gate 103b, the first spacer 1035a and the second spacer 1035b, and the ILD 101. In some embodiments, the CMP process has low dishing and/or metal erosion effect.

In some embodiments, for example, the first spacer 1035a and the second spacer 1035b include silicon oxide, silicon nitride, silicon oxynitride, other suitable materials, and/or combinations thereof. The spacers can be formed by ALD, CVD, metalorganic CVD (MOCVD), PVD, plasma enhanced CVD (PECVD), plasma enhance ALD (PEALD), thermal oxidation, combinations thereof, or other suitable techniques.

In some embodiments of the present disclosure, the first high-k dielectric layer 1033a and the second high-k dielectric layer 1033b are formed by ALD, CVD, metalorganic CVD (MOCVD), PVD, plasma enhanced CVD (PECVD), plasma enhance ALD (PEALD), thermal oxidation, combinations thereof, or other suitable technique. In some embodiments, the first high-k dielectric layer 1033a and the second high-k dielectric layer 1033b include a thickness ranging from about 5 to about 30 Å. The first high-k dielectric layer 1033a and the second high-k dielectric layer 1033b include a binary or ternary high-k film. In some embodiments, the first high-k dielectric layer 1033a and the second high-k dielectric layer 1033b include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

In some embodiments, first metal gate layer 105a and second metal gate layer 105b include a capping layer, a work function metal layer, and a gate fill metal, respectively.

The capping layer includes metal nitrides such as TiN, TaN, or metal carbonitride such as titanium carbonitride or another quaternary layer which has a general formula ($M_1$, $M_2$) (C, N), wherein $M_1$ and $M_2$ are different metals of IVa or Va group. In some embodiments, the capping layer has a thickness ranging from about 2 Å to about 40 Å. The capping layer functions as a barrier to protect the high-k dielectric layers 1033a and 1033b. The capping layer is formed by various deposition techniques such as ALD, PVD, CVD, PECVD, or other suitable techniques.

In some embodiments, the capping layer is a composite film stack that includes at least two layers of materials. For example, one layer of the capping layers that is proximal to the high-k dielectric layers (1033a or 1033b) is made of metal nitrides or metal carbonitride of a first composition, whereas the another capping layer that is proximal to the work function metal layer is made of metal nitrides or metal carbonitride of a second composition. For example, the composite films of the work function metal layer can be an identical material but for the different atomic concentration. For example, the composite films of the work function metal layer can be different materials.

In some embodiments, the capping layer proximal to the high-k dielectric layer (1033a or 1033b) is called a barrier layer. In some embodiments, a thickness of the capping layer that is proximal to the high-k dielectric layer (1033a or 1033b) is from about 1 to about 20 Å. A thickness of the capping layers that is proximal to the work function metal layer 1035 is of from about 1 to about 20 Å.

In some embodiments, the work function metal layer includes metal carbonitride such as TiN, metal silicon nitride such as TiSiN, or metal aluminide. In some embodiments, the work function metal layer is made of metal carbonitride or metal silicon nitride. In other embodiments, the work function metal layer includes TiAlN, TiAl, or TaAl. The work function metal layer can be deposited through various deposition techniques such as ALD, PVD, CVD, PECVD, or other suitable techniques. In some embodiments, a thickness of the work function metal layer is within a range of from about 1 Å to about 100 Å.

In some embodiments, a gate fill metal is disposed in the metal gates 103a and 103b. The gate fill metal includes metals having a stand alone work function that is between 4.2 to 4.8 eV. In some embodiments, the gate fill metal includes W, Al, Co, and the alloys thereof. In some embodiments, a thickness of the gate fill metal is between about 50 to 3000 Å.

In some embodiments, for example, the first SAC hard mask 107a and the second SAC hard mask 107b can be formed by CVD, PECVD, HDP, IPM, or other suitable techniques. In some embodiments, the first SAC hard mask 107a and the second SAC hard mask 107b include a thickness ranging from about 50 to about 400 Å. In some embodiments, the first SAC hard mask 107a and the second SAC hard mask 107b include nitride.

Figure 2:
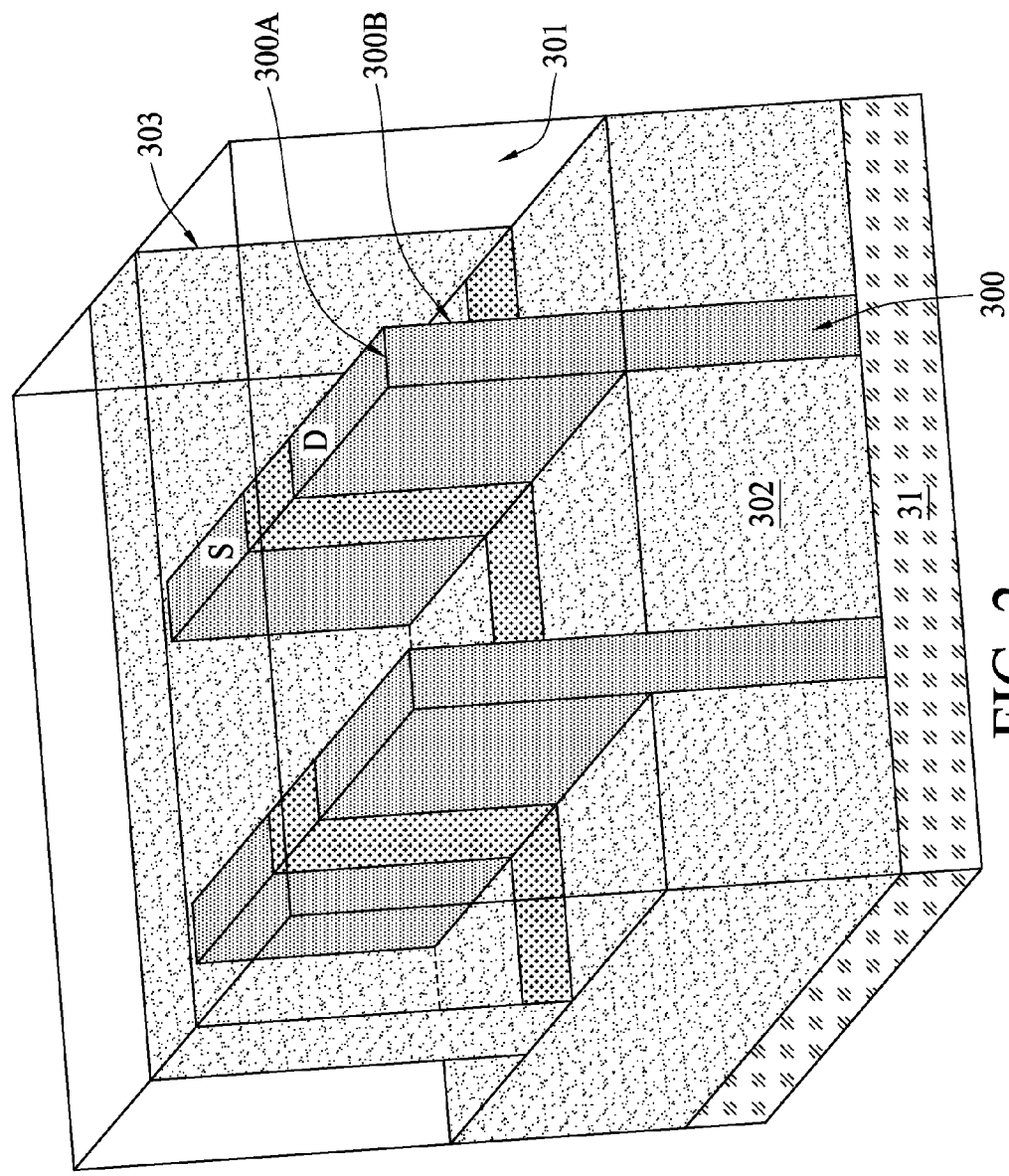
FIG. 2 is a perspective view of a Fin Field Effect Transistor (FinFET) with a metal gate structure in accordance with some embodiments of the present disclosure.

Due to the shrinkage of the semiconductor device size, a FinFET structure is used to improve device performance. FIG. 2 is a perspective view of the FinFET structure 30. Two semiconductor fins 300 are positioned on a substrate 31 and are separated by an STI 302. A semiconductor fin 300 may be formed of silicon, silicon-germanium, germanium, or other suitable semiconductor materials. A metal gate 303 is over a top surface 300A and a sidewall 300B of the semiconductor fins 300. A channel of a transistor (not shown) is defined along the top surface 300A and the sidewall 300B of the semiconductor fin and extended between source/drain regions in the semiconductor fin 300. As shown in FIG. 2, ILD 301 is positioned to cover and surround the semiconductor fins 300.

In some embodiments, the semiconductor structure 10 is a planar N-MOSFET or P-MOSFET with a channel length $L_g$ of from about 10 to about 40 nm. In other embodiments, the semiconductor structure 10 is a nonplanar N-FinFET or P-FinFET with a channel length $L_g$ of from about 5 to about 40 nm.

FIG. 3 to FIG. 21 are the operations of a semiconductor structure manufacturing method for a metal gate structure in accordance with some embodiments of the present disclosure.

Figure 3:
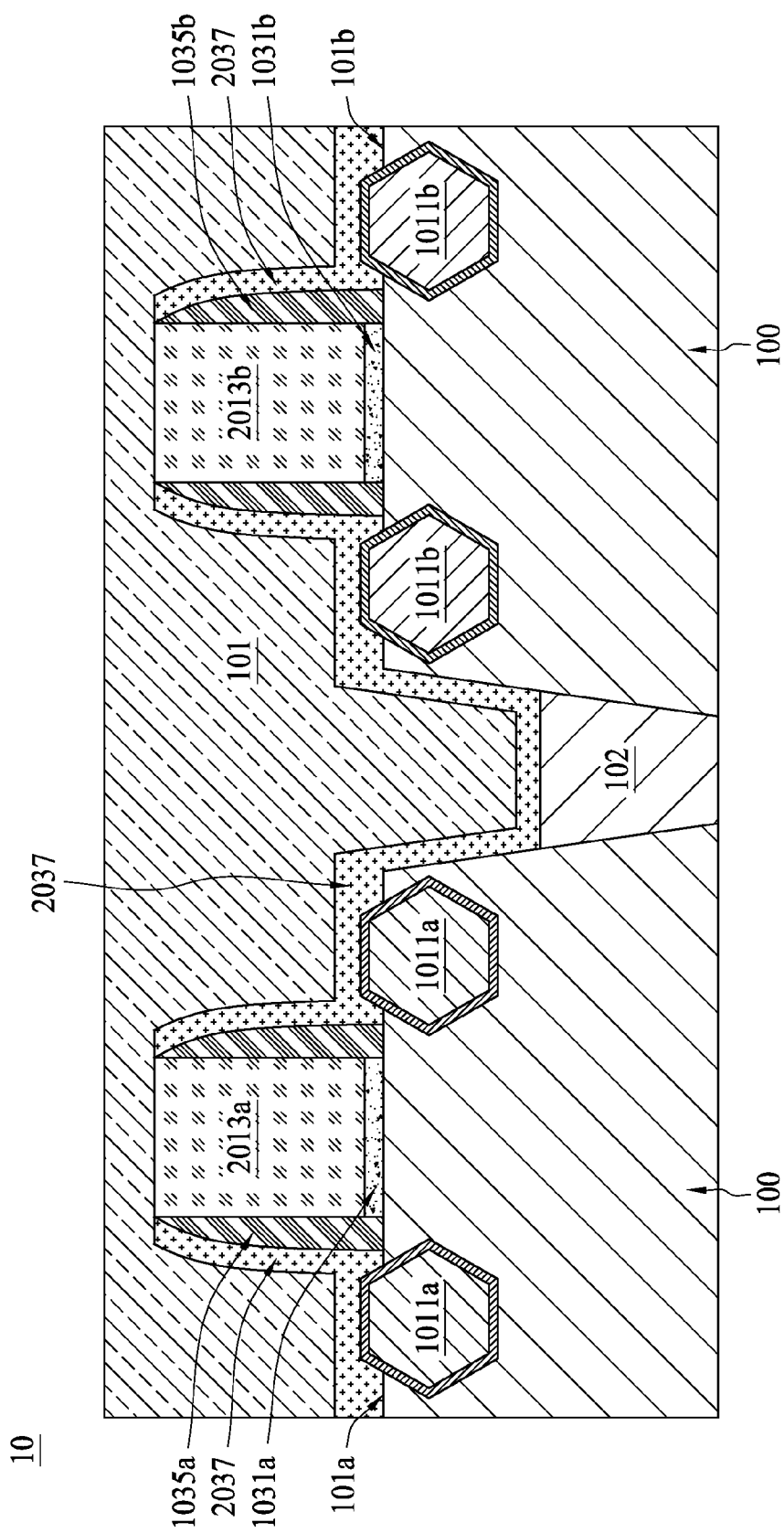
FIG. 3 is an operation of a semiconductor structure manufacturing method for metal gate structures in accordance with some embodiments of the present disclosure.

In FIG. 3, sacrificial gate electrodes 2013a and 2013b are capped within the ILD 101.

In some embodiments, a first interlayer 1031a and a second interlayer 1031b are formed from a material which has a selectivity during the removal or etching of the sacrificial gate electrodes 2013a and 2013b. The interlayer acts as a protective layer for the underlying semiconductor layer 100 when the sacrificial gate electrodes 2013a and 2013b are removed. If the interlayers 1031a and 1031b are thermally grown dielectrics, they will be formed only on the exposed surfaces of the semiconductor layer 100. If the interlayers 1031a and 1031b are formed by deposition operation, they will be blanket deposited onto an insulating substrate (not shown) underneath the semiconductor layer 100 as well as onto the semiconductor layer 100.

The spacers 1035a and 1035b are formed on the sidewalls of the sacrificial gate electrodes 2013a and 2013b, respectively. The longitudinal portion of the outer spacer 2037 is sandwiched between the spacers 1035a, 1035b and ILD 101.

The lateral portion of the outer spacer 2037 is sandwiched between surfaces 101a, 101b and ILD 101. Both the spacers 1035a and 1035b and outer spacer 2037 can be formed by blanket depositing a conformal dielectric film to cover the sacrificial gate electrodes 2013a and 2013b. In some embodiments, the outer spacer 2037 comprises nitride.

Materials forming the spacers and the outer spacer 2037 include, but are not limited to, silicon nitride, silicon oxide, silicon oxynitride or a combination thereof. In some embodiment of the present disclosure, the spacers are a silicon nitride film formed by a hot wall, low pressure chemical vapor deposition (LPCVD) operation. Anisotropical etch may be adopted to remove a portion of the blanket deposited spacers and outer spacer films.

Figure 4:
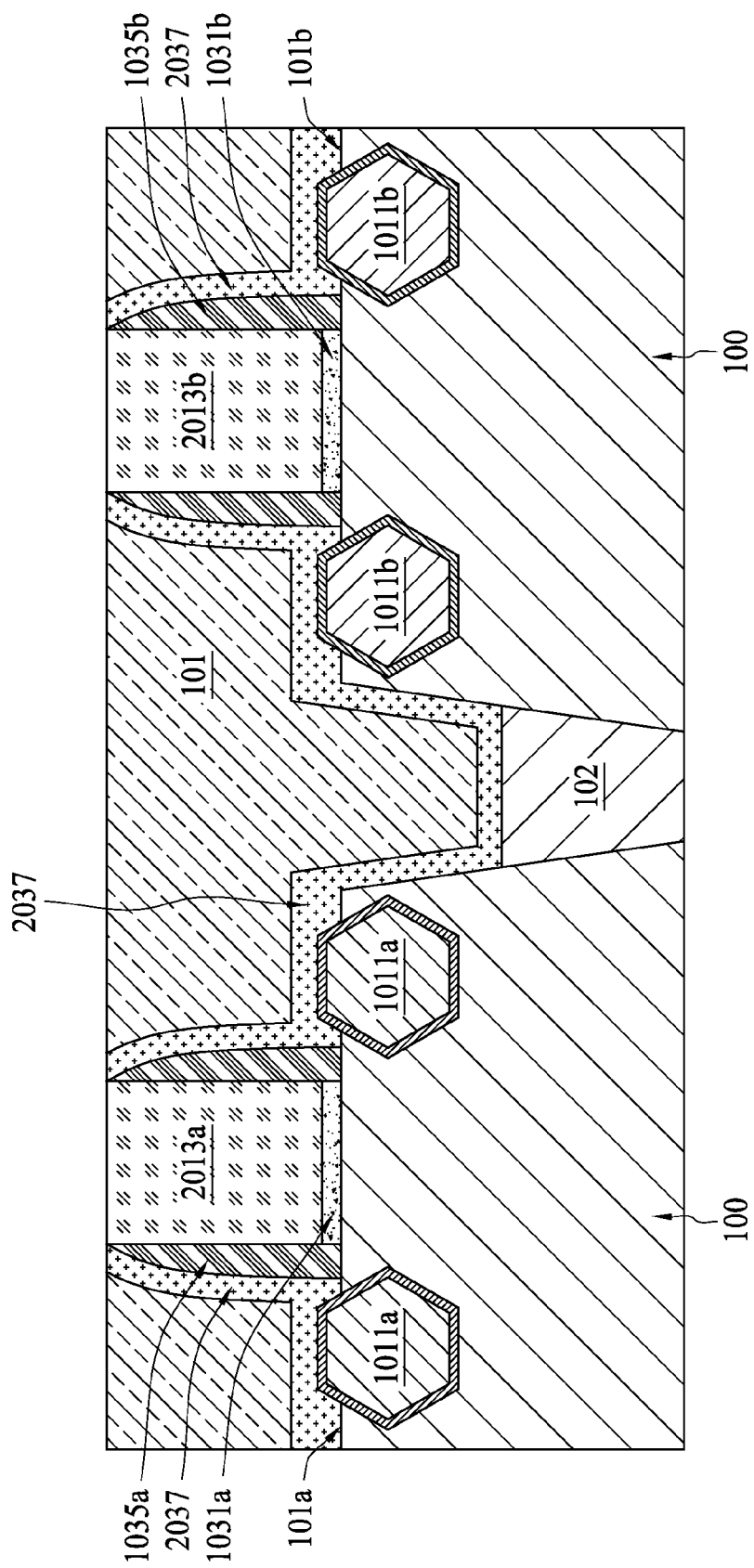
FIG. 4 is an operation of a semiconductor structure manufacturing method for metal gate structures in accordance with some embodiments of the present disclosure.

In FIG. 4, a planarization operation such as a chemical mechanical polishing (CMP) operation is performed after formation of ILD 101. The planarization operation is carried out to remove the excessive ILD 101 over the top surfaces of the sacrificial gate electrodes 2013a and 2013b until the sacrificial gate electrodes 2013a and 2013b are exposed from the ILD 101.

Figure 5:
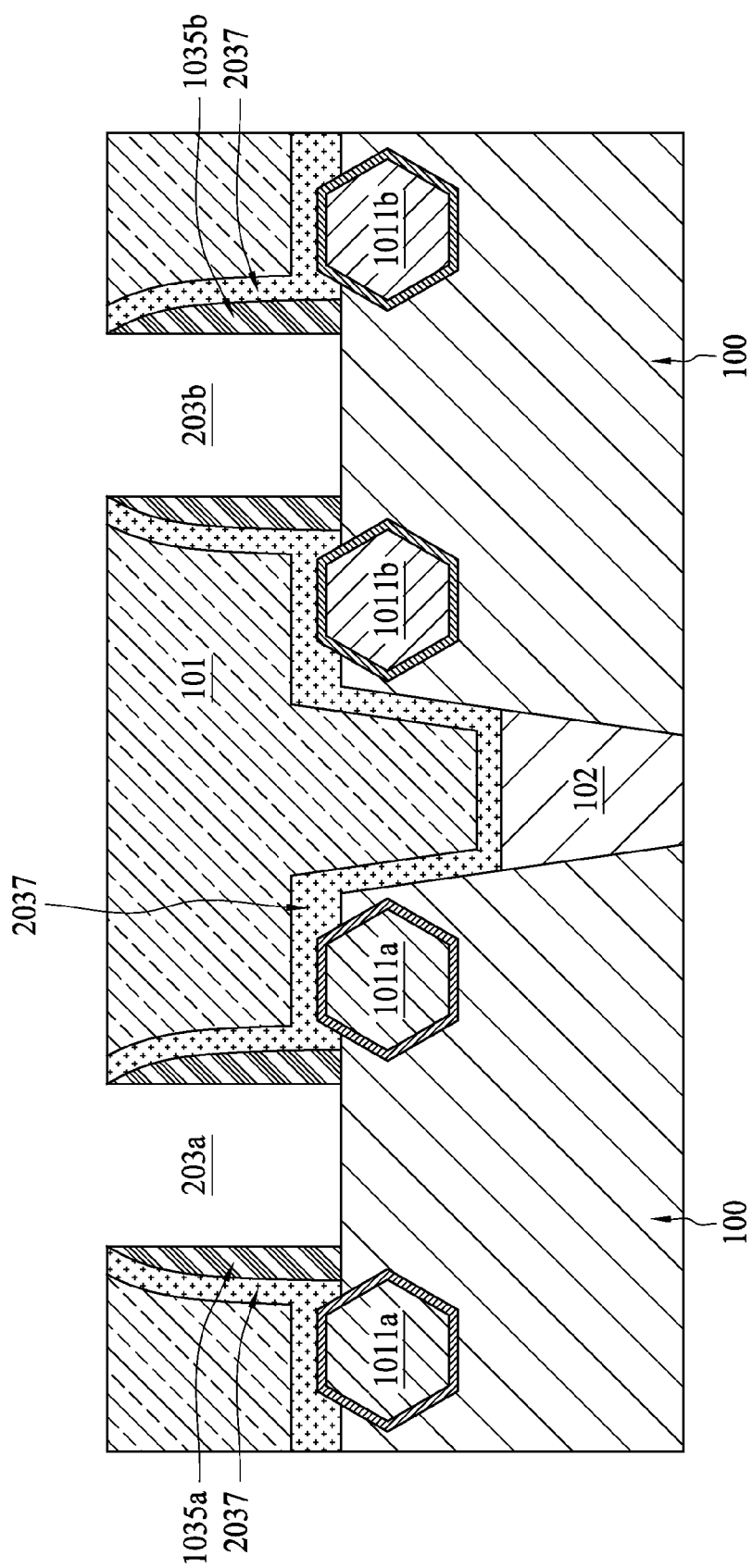
FIG. 5 is an operation of a semiconductor structure manufacturing method for metal gate structures in accordance with some embodiments of the present disclosure.

In FIG. 5, a first metal gate recess 203a is formed by removing the first sacrificial gate electrode 2013a and the interlayer 1031a. A second metal gate recess 203b is formed by removing the second sacrificial gate electrode 2013b and the interlayer 1031b. In some embodiments, the sacrificial gate electrodes 2013a and 2013b are formed of polysilicon. The polysilicon sacrificial gate electrodes 2013a and 2013b are removed by utilizing a wet etchant comprising tetramethylammonium hydroxide and water.

In an embodiment of the present disclosure, the wet etchant solution comprises about 10-35% tetramethylammonium hydroxide by volume. In an embodiment of the present disclosure, the tetramethylammonium hydroxide solution is heated to a temperature between 60-95 degrees Celsius during etching. In an embodiment of the present disclosure, sonic energy such as, ultrasonic or megasonic energy, is applied during the etch process. Sonic energy provides agitation to the etchant which enables etch residue to be removed from altered sacrificial gate electrodes 2013a, 2013b and allows new etchants to enter into the trenches so as to etch the sacrificial gate electrodes 2013a and 2013b, respectively.

In some embodiments of the present disclosure, the etchant for the first sacrificial gate electrode 2013a is selective to the interlayer 1031a, and the etchant for the second sacrificial gate electrode 2013b is selective to the interlayer 1031b. (i.e., does not etch or only slightly etches the interlayers 1031a and 1031b), so that the interlayers 1031a and 1031b act as an etch stop for the sacrificial gate electrodes 2013a and 2013b etch, respectively. In this way, the underlying channel region of the first metal gate recess 203a and the underlying channel region of the second metal gate recess 203b are protected from the etchant. In some embodiments, an etch selectivity between a sacrificial gate electrode to an interlayer dielectric of at least 10:1 is desired.

Proceeding to next operation, the interlayers 1031a and 1031b are removed. In an embodiment of the present disclosure, the interlayers 1031a and 1031b are oxide and can be removed with an etchant comprising aqueous hydrofluoric acid. In an embodiment of the present disclosure, a etchant solution with 1-2% HF by volume is used.

Figure 6:
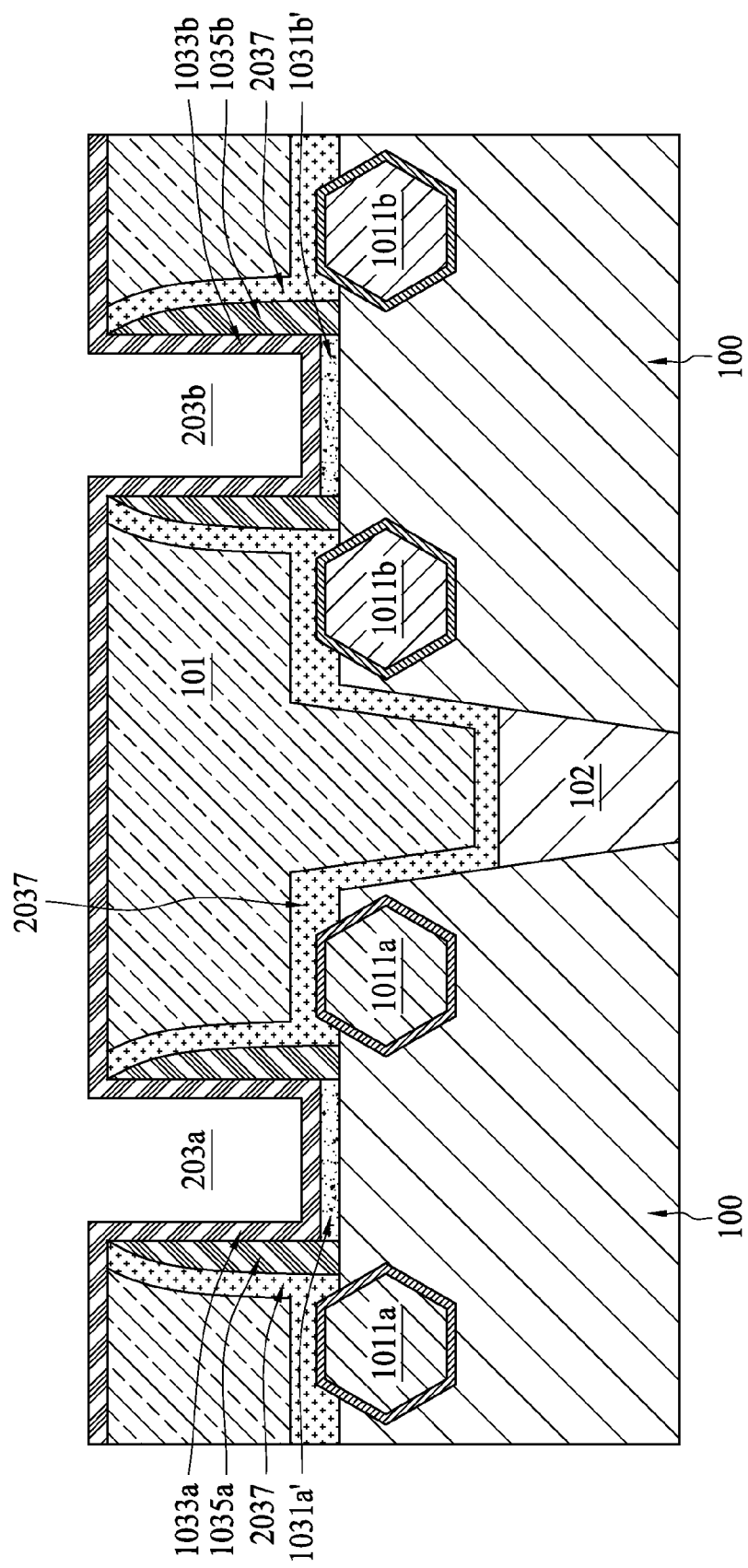
FIG. 6 is an operation of a semiconductor structure manufacturing method for metal gate structures in accordance with some embodiments of the present disclosure.

Referring to FIG. 6, interlayers 1031a' and 1031b' are formed on the bottom portion of the metal gate recesses 203a and 203b. A first high-k dielectric layer 1033a is formed in a conformal manner inside the first metal gate recesses 203a and on the top of the ILD 101. Similarly, a second high-k dielectric layer 1033b is formed in a conformal manner inside the second metal gate recesses 203b and on the top of the ILD 101. In some embodiments, the interlayers 1031a' and 1031b' are optional to the designer, such that the high-k dielectric layers 1033a and 1033b can be directly formed proximal to the channel region of the semiconductor layer 100.

In an embodiment of the present disclosure, the high-k dielectric layers 1033a and 1033b are grown to a thickness of between about 5-50 Å, respectively. In an embodiment of the present disclosure, the high-k dielectric layers 1033a and 1033b are a deposited dielectric, such as but not limited to a metal oxide dielectric, such as tantalum pentoxide ($Ta_2O_5$) and titanium oxide ($TiO_2$), tantalum oxide, hafnium oxide, zirconium oxide, aluminum oxide, lanthanum oxide, lanthanum aluminum oxide and silicates thereof or other high k dielectrics, such as PZT and BST. The high-k dielectric film can be formed by a technique, such as but not limited to chemical vapor deposition (CVD) or atomic layer deposition (ALD).

Figure 7:
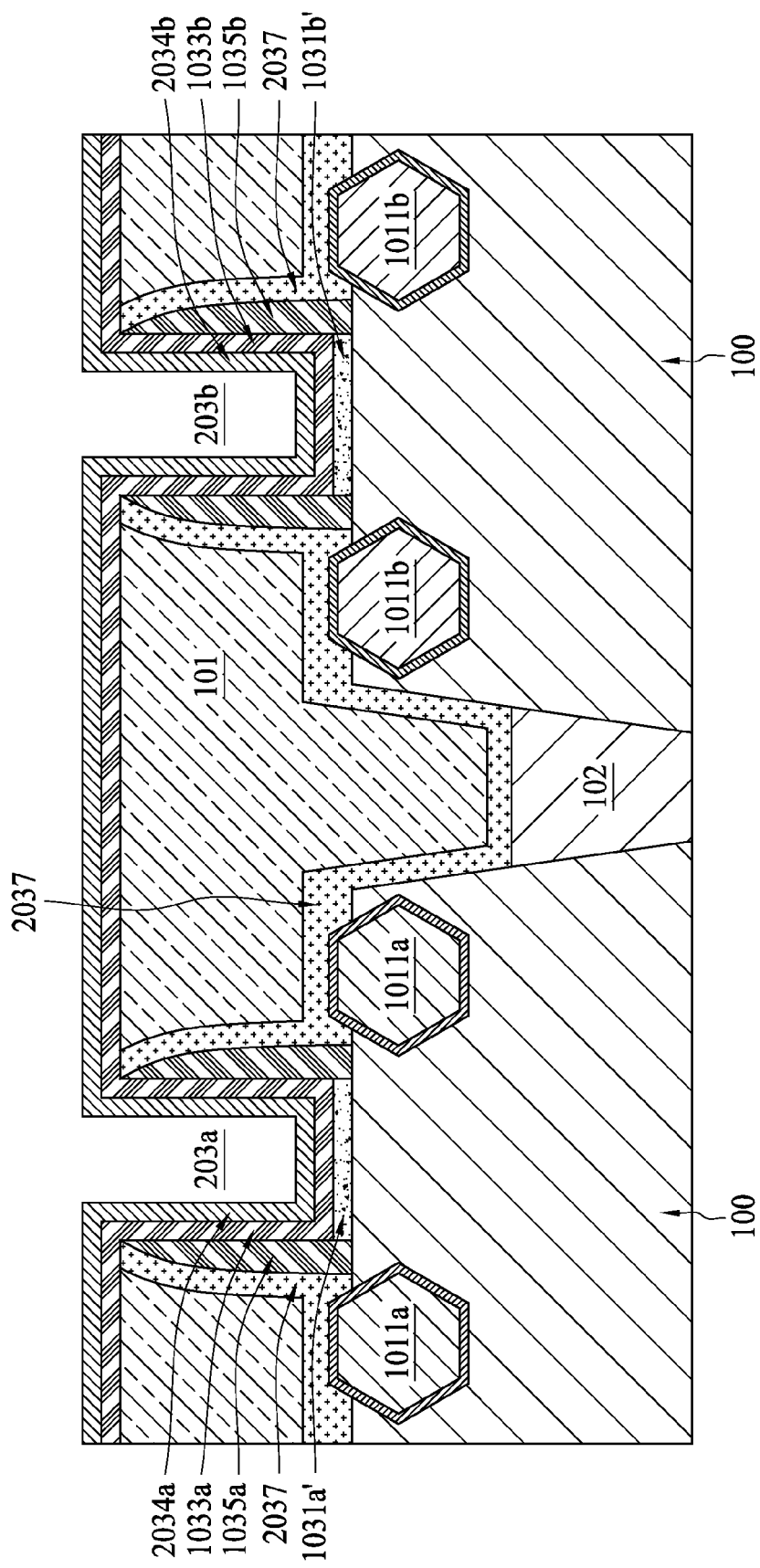
FIG. 7 is an operation of a semiconductor structure manufacturing method for metal gate structures in accordance with some embodiments of the present disclosure.

Referring to FIG. 7, a first capping layer 2034a is formed on the first high-k dielectric layer 1033a and a second capping layer 2034b is formed on the second high-k dielectric layer 1033b. In some embodiments, the capping layers 2034a and 2034b include TiN or TaN with a thickness ranging from about 1 to about 30 Å. The capping layers 2034a and 2034b function as a barrier to protect the high-k dielectric layers 1033a and 1033b. The capping layers 2034a and 2034b can be formed by various deposition techniques such as ALD, PVD, CVD, PECVD, or other suitable techniques.

In some embodiments, the capping layers 2034a and 2034b include a composite film stack. For example, the composite film stack can be made of any two of metal carbonitride layer, TiN, and TaN. In some embodiments, the TiN or the TaN can have a thickness of from about 1 to about 20 Å.

Figure 8:
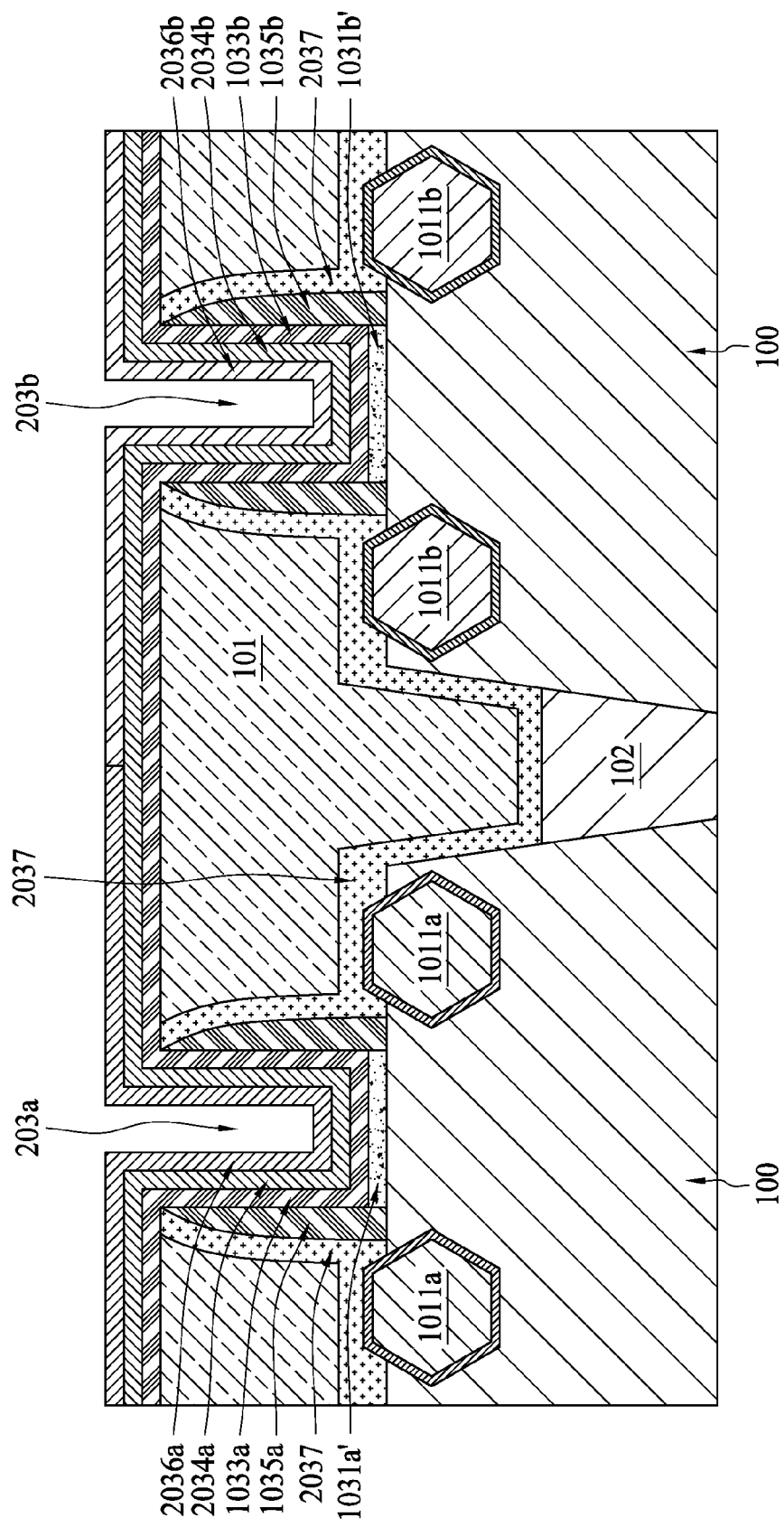
FIG. 8 is an operation of a semiconductor structure manufacturing method for metal gate structures in accordance with some embodiments of the present disclosure.

FIG. 8 shows a cross section view after forming a first work function metal layer 2036a in the first metal gate recess 203a and a second work function metal layer 2036b in the second metal gate recess 203b. A designer can use patterning technology in the art to form the work function metals 2036a and 2036b, respectively.

For simplicity, a transistor including the first work function metal layer 2036a is defined as first transistor, and a transistor including the second work function metal layer 2036b is defined as second transistor. The work function metal layers 2036a and 2036b respectively formed in the metal gate recesses 203a and 203b have rendered the first and second transistors to be in opposite conductive type. For example, if the first transistor functions as a P-type transistor, the second transistor functions as an N-type transistor.

In some embodiments, the work function metal layers 2036a and 2036b are formed on the capping layers 2034a and 2034b by an atomic layer deposition, a physical vapor deposition, a chemical vapor deposition, sputtering, or other suitable operations. In some embodiments, the work function metal layers 2036a and 2036b include suitable metals compound such as metal carbonitride, metal aluminide, metal silicon nitride, TiN, TiSiN, TiAlN, TiAl, TaAl, TaN, or Ru. In some embodiments, the work function metal layers 2036a and 2036b include a multi-metal layer structure such as TiN/WN.

In some embodiments, aluminum atom is doped within the work function metal layer 2036a or 2036b via an ALD operation. In other embodiments, an aluminum ion implantation operation is carried out after the formation of the work function metal layer 2036a or 2036b in order to adjust the threshold voltage or the work function of the metal gate electrode.

Figure 9:
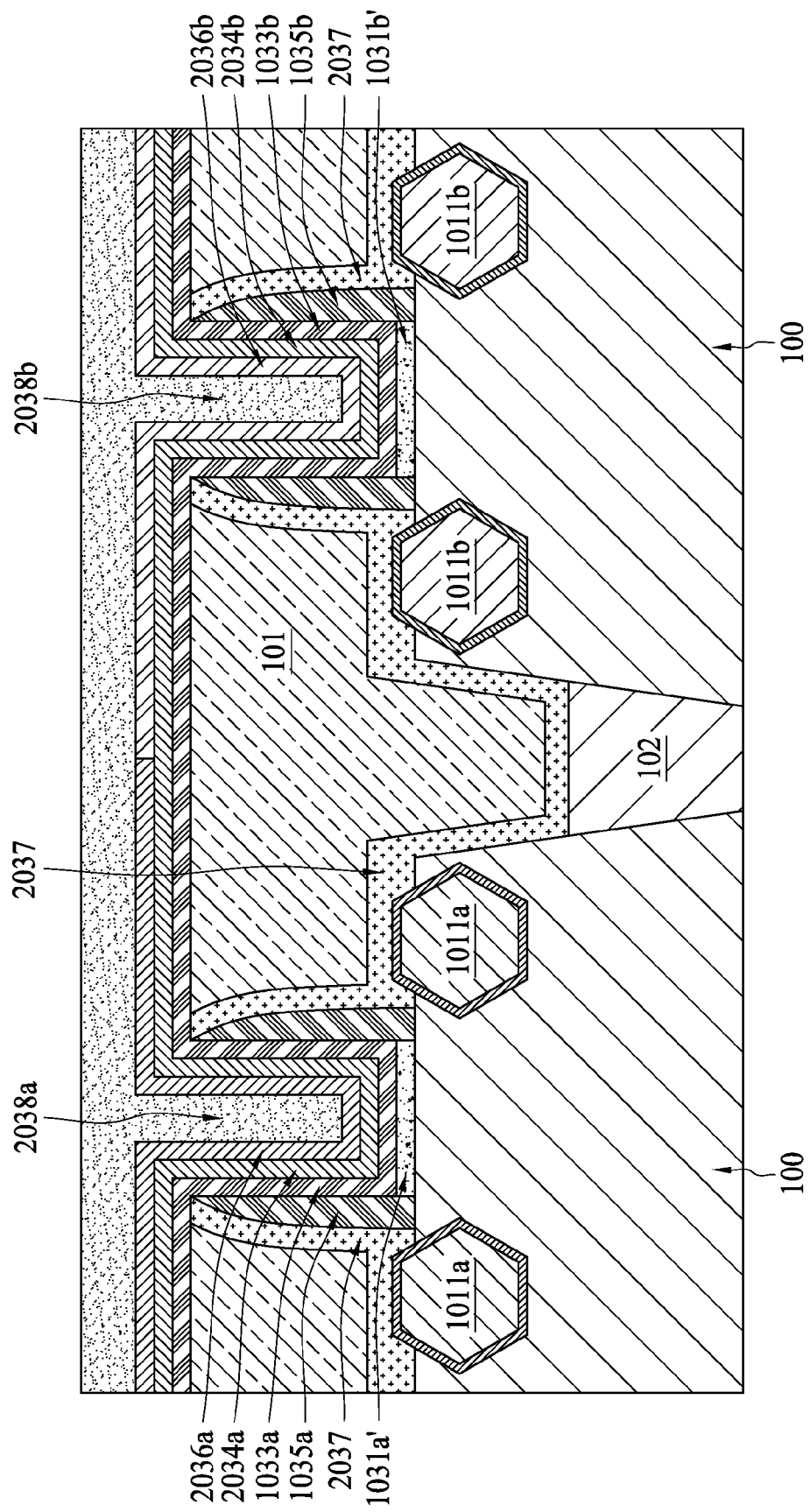
FIG. 9 is an operation of a semiconductor structure manufacturing method for metal gate structures in accordance with some embodiments of the present disclosure.

Referring to FIG. 9, the gate recesses are formed with filling metal such as 2038a and 2038b. In some embodiments, the filling metal overfills the recesses. In some embodiments, a single metal including Al, W, WN, TaN, or Ru is sputtered into the metal gate recesses 203a and 203b, and followed by a CMP operation (not shown) to remove the excessive gate fill metals 2038a/2038b. In some embodiments, work function metal layers 2036a/2036b, capping layers 2034a/2034b, and high-k dielectric layers 1033a/1033b are also removed from the top surface of the ILD 101. In some embodiments, the gate fill metal 2038a and 2038b include a composite film stack structure such as TaN, TiN, W, WN, and WCN, or any combination thereof.

Figure 10:
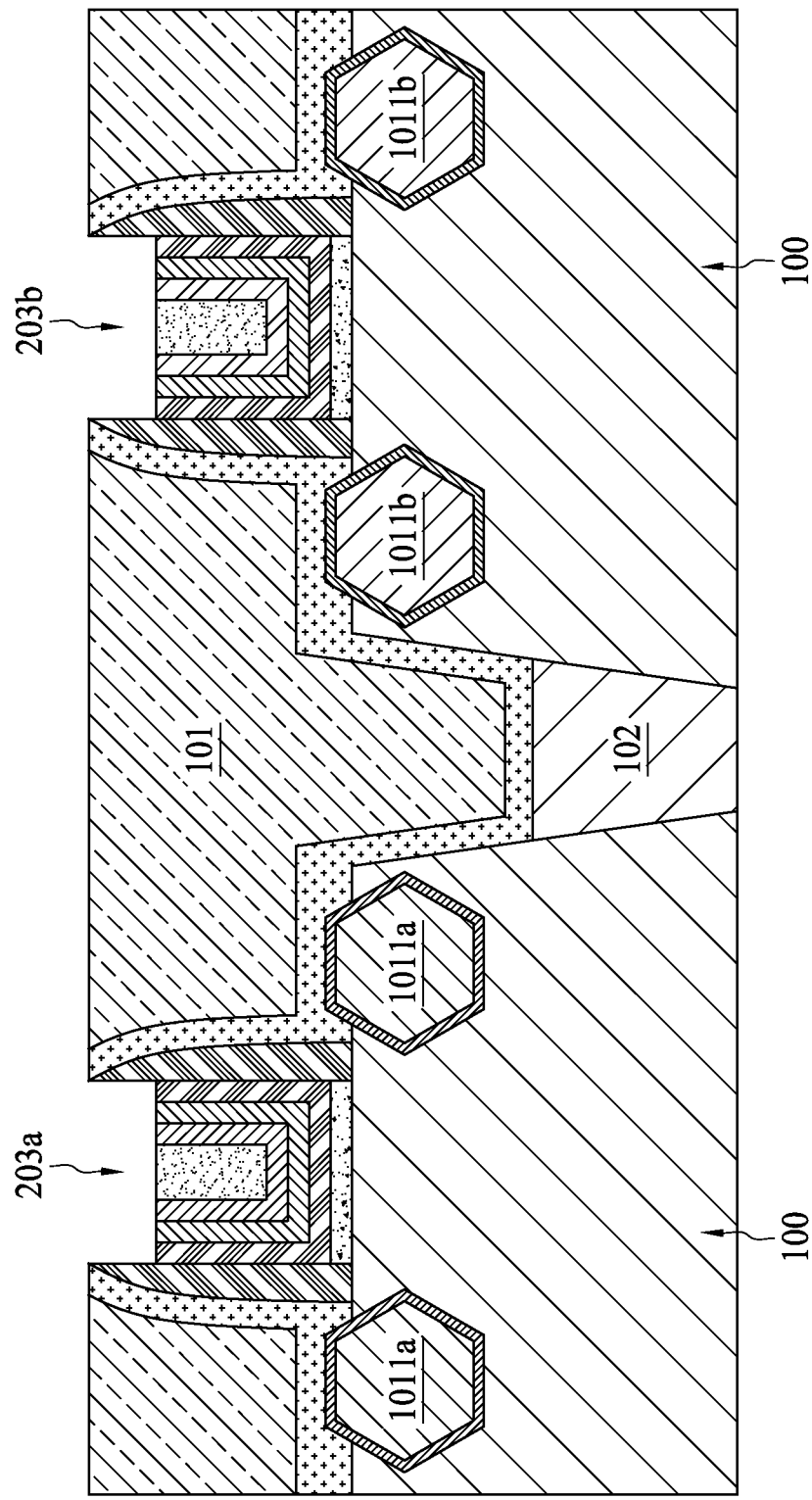
FIG. 10 is an operation of a semiconductor structure manufacturing method for metal gate structures in accordance with some embodiments of the present disclosure.

For simplicity, after filling the gate fill metal 2038a and 2038b, a metal gate structure including the first work function metal layer 2036a is defined as first metal gate, and a metal gate structure including the second work function metal layer 2036b is defined as second metal gate. In FIG. 10, upper portion of the first and second metal gate are etched back to define trenches in the first metal gate and the second metal gate. In some embodiments, the etching back process of the first and second metal gate is a wet etch process. In some embodiments, an etchant used in the wet etch process is phosphoric acid.

Figure 11:
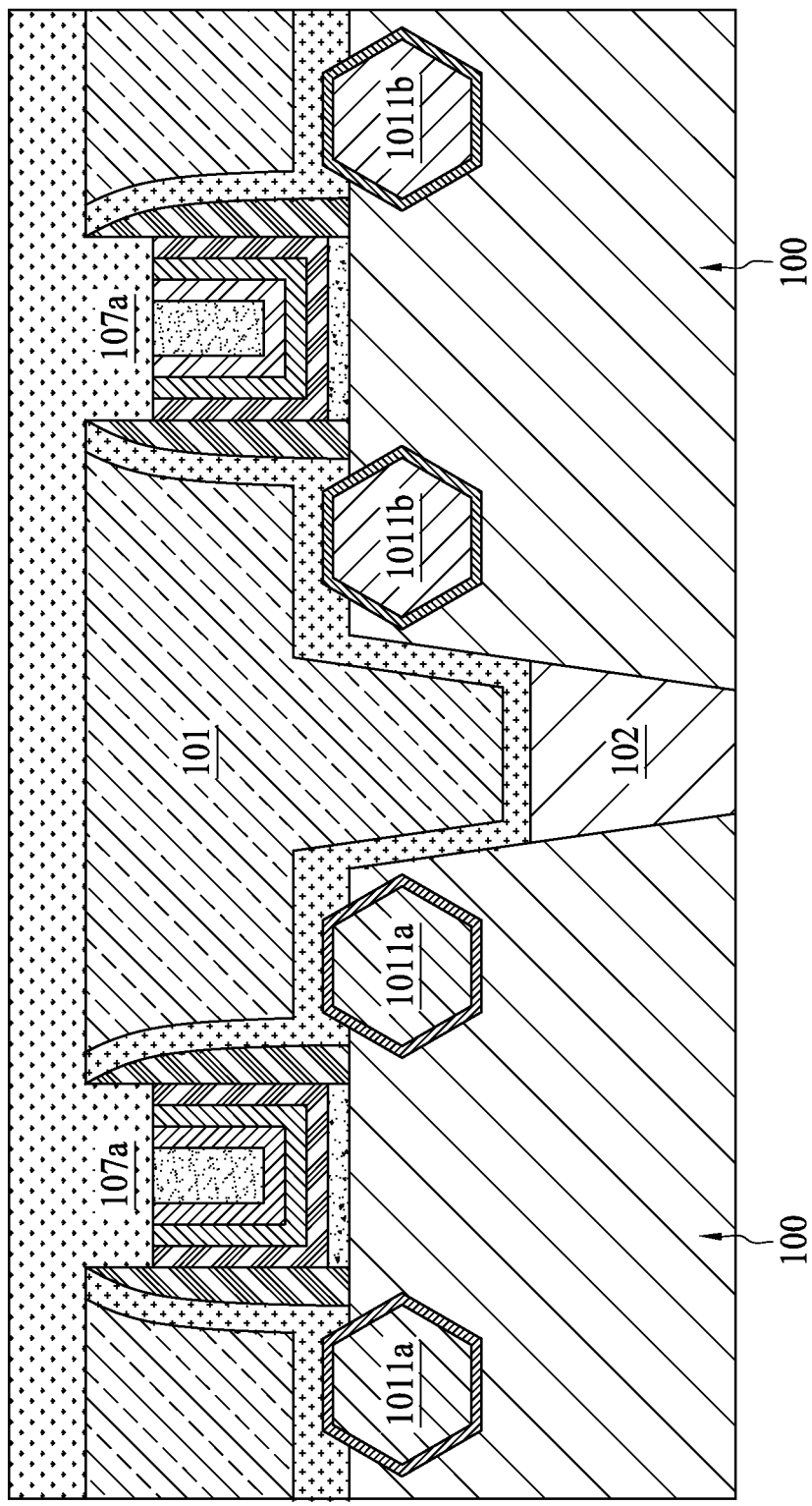
FIG. 11 is an operation of a semiconductor structure manufacturing method for a metal gate structure in accordance with some embodiments of the present disclosure.
Figure 12:
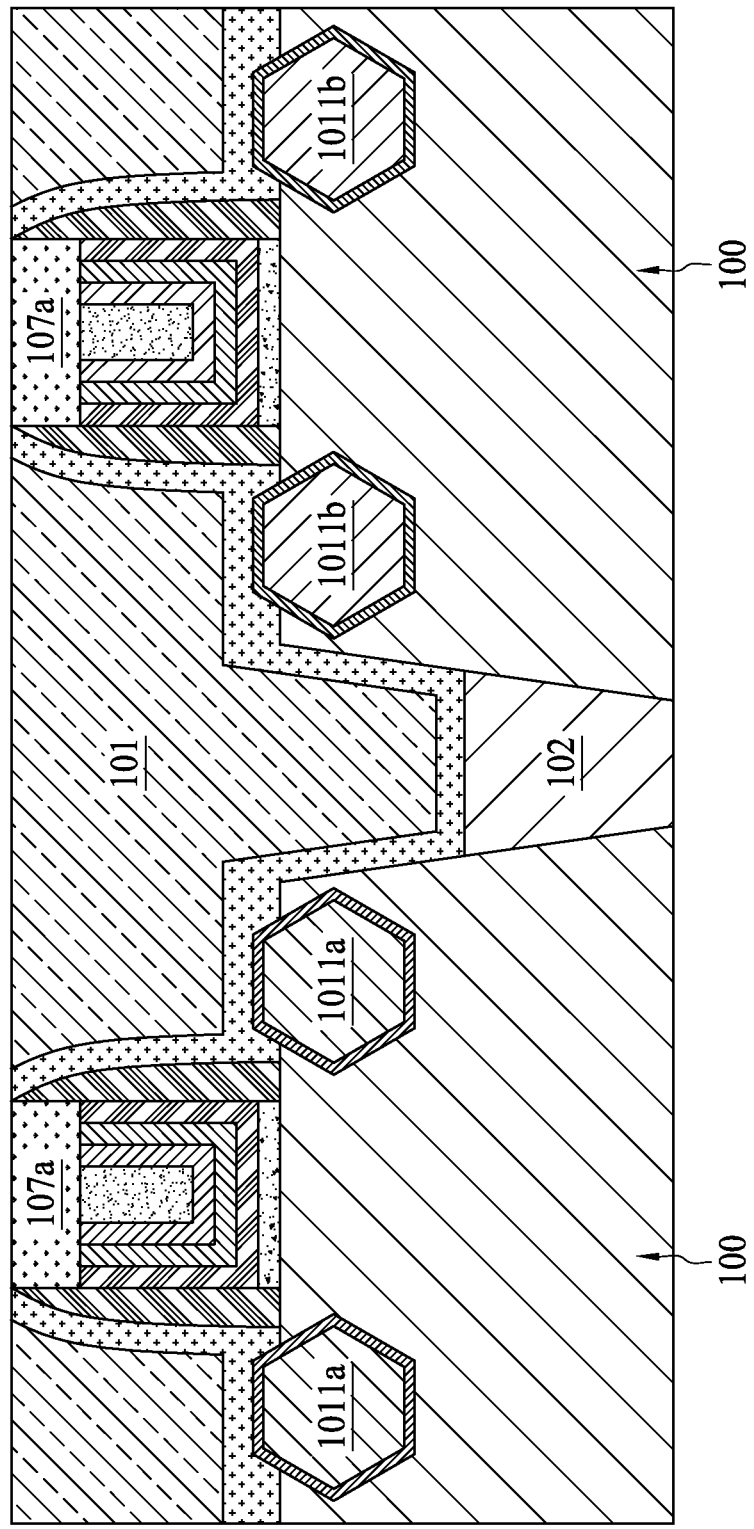
FIG. 12 is an operation of a semiconductor structure manufacturing method for metal gates and hard masks in accordance with some embodiments of the present disclosure.

In FIG. 11, a first SAC hard mask 107a is formed on the ILD 101 and covers trench in the metal gate. A portion of the first SAC hard mask 107a is removed to reach a predetermined height such that at least part of the first SAC hard mask 107a is remained in the trench as shown in FIG. 12.

Figure 13:
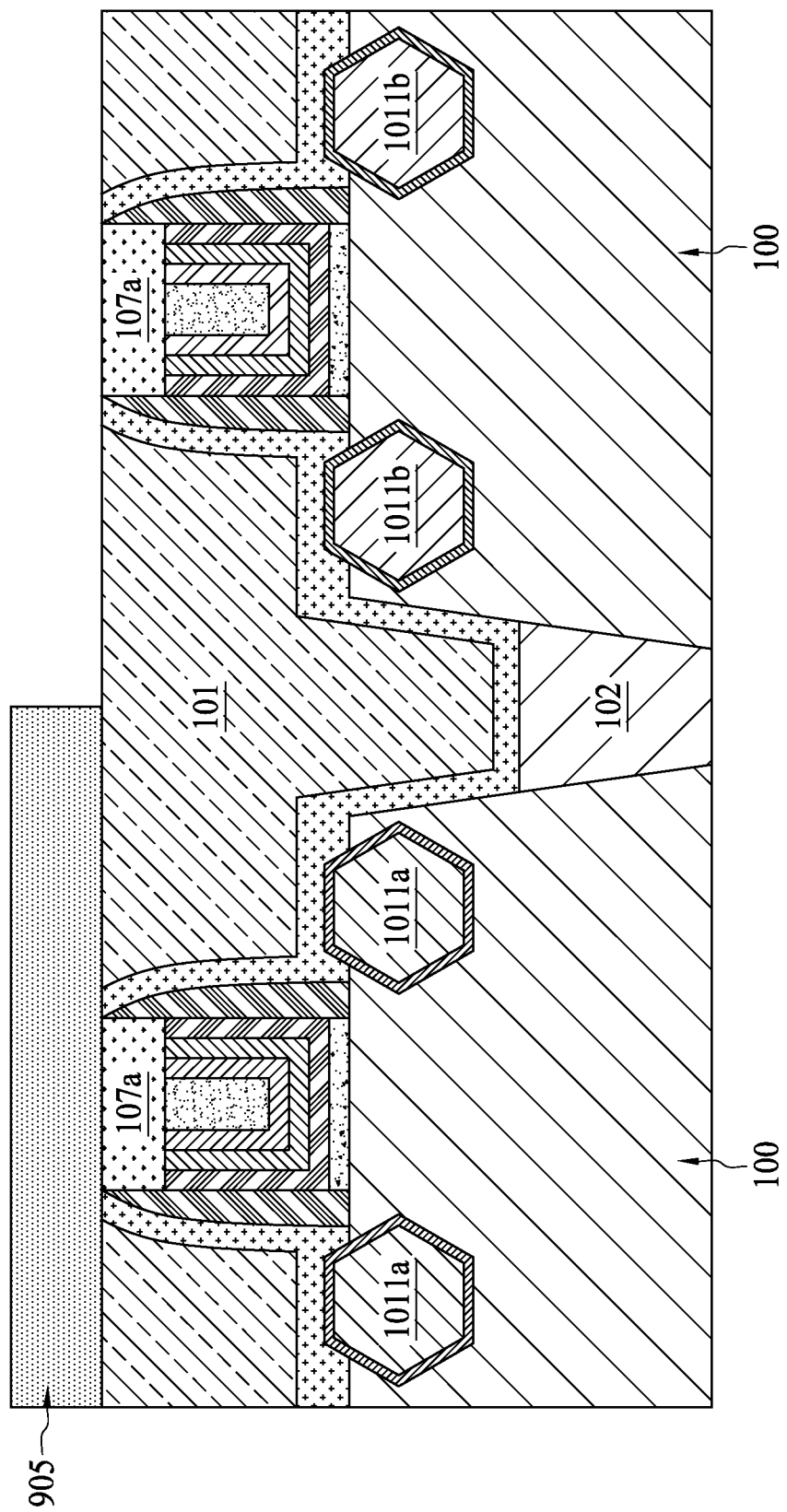
FIG. 13 is an operation of a semiconductor structure manufacturing method for metal gates and hard masks in accordance with some embodiments of the present disclosure.
Figure 14:
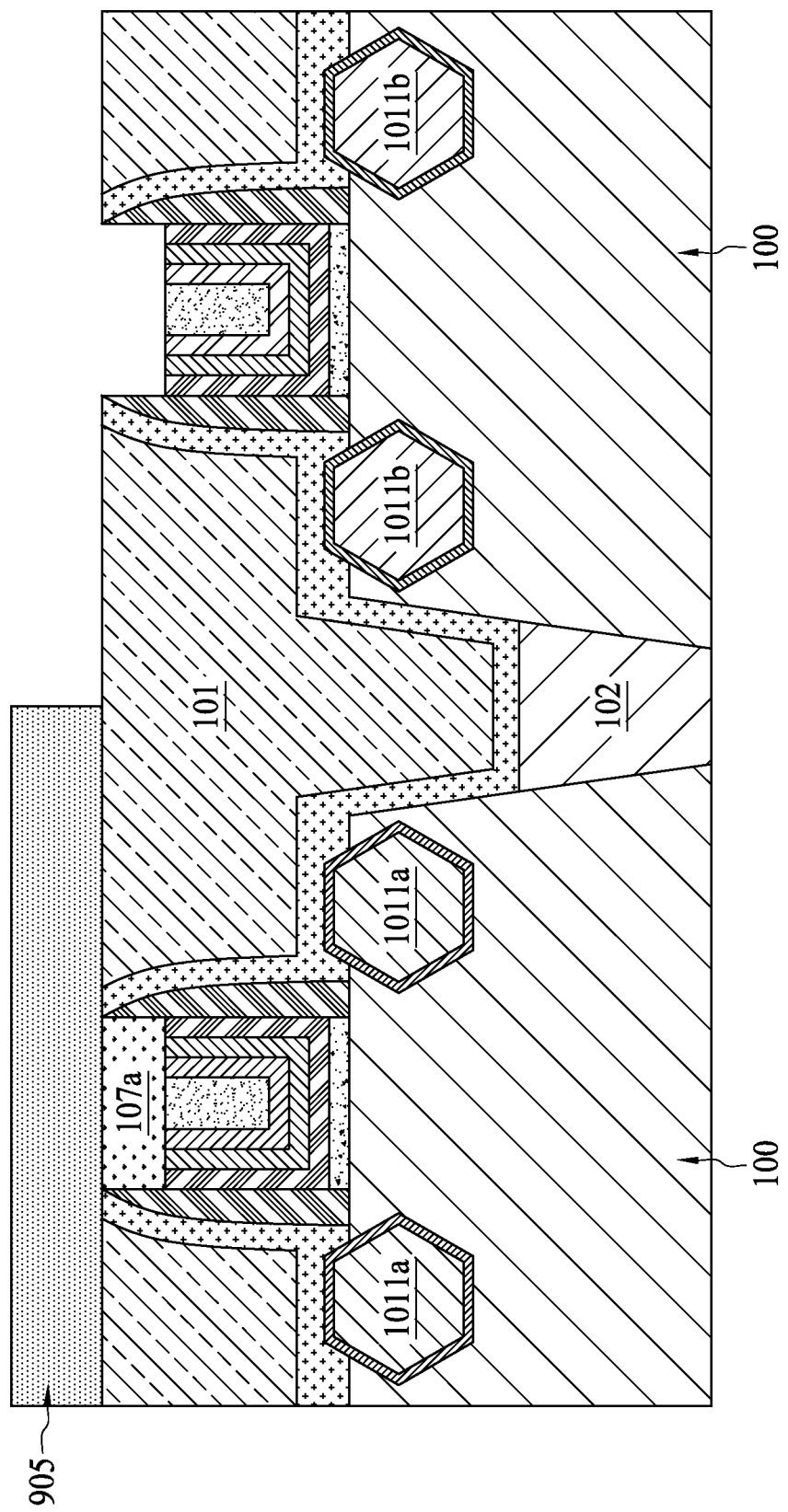
FIG. 14 is an operation of a semiconductor structure manufacturing method for metal gates and hard masks in accordance with some embodiments of the present disclosure.

Referring to FIG. 13, a photoresist 905 is formed on the first SAC hard mask 107a and part of the ILD 101, such that at least part of the second metal gate is exposed. In FIG. 14, the first SAC hard mask 107a in the second metal gate is removed.

Figure 15:
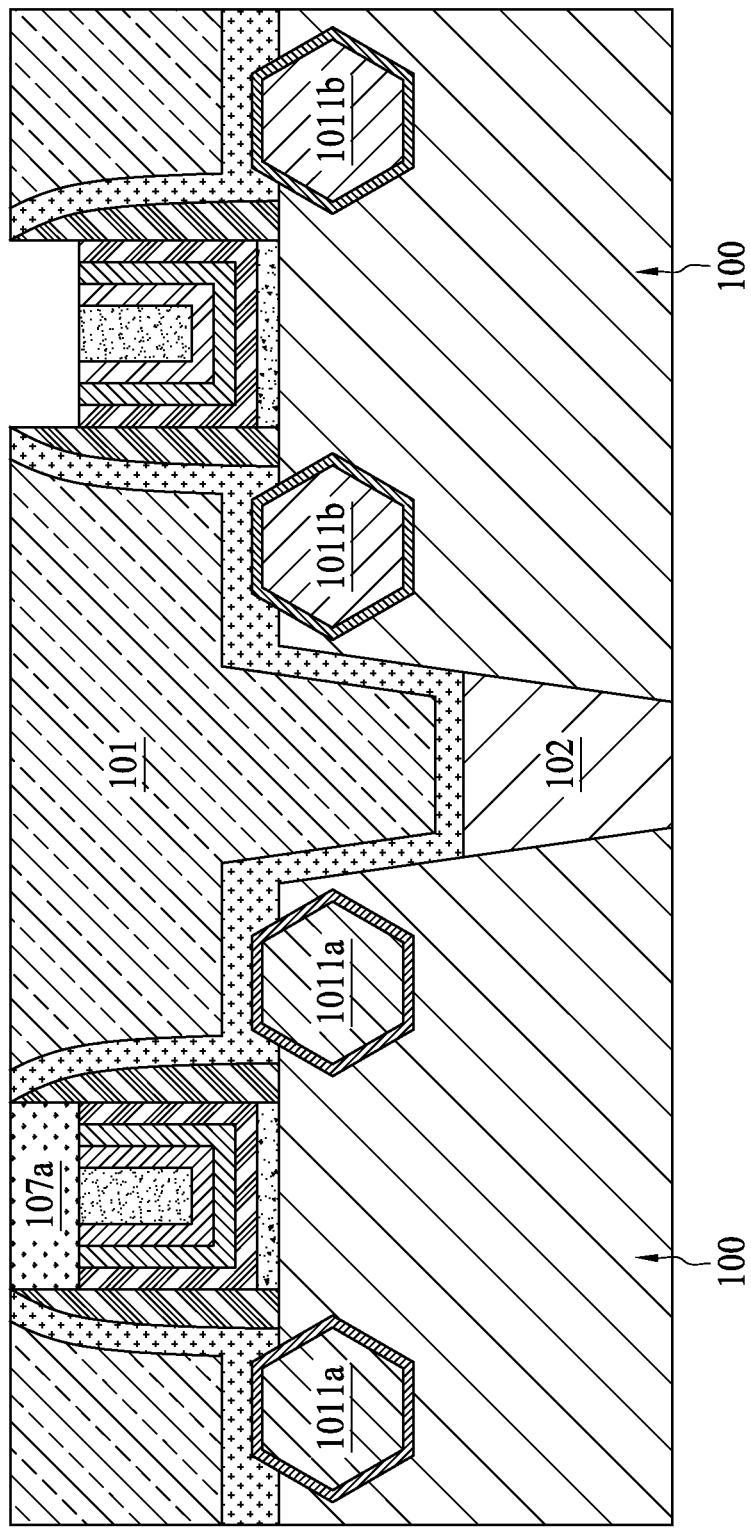
FIG. 15 is an operation of a semiconductor structure manufacturing method for metal gates and hard masks in accordance with some embodiments of the present disclosure.
Figure 16:
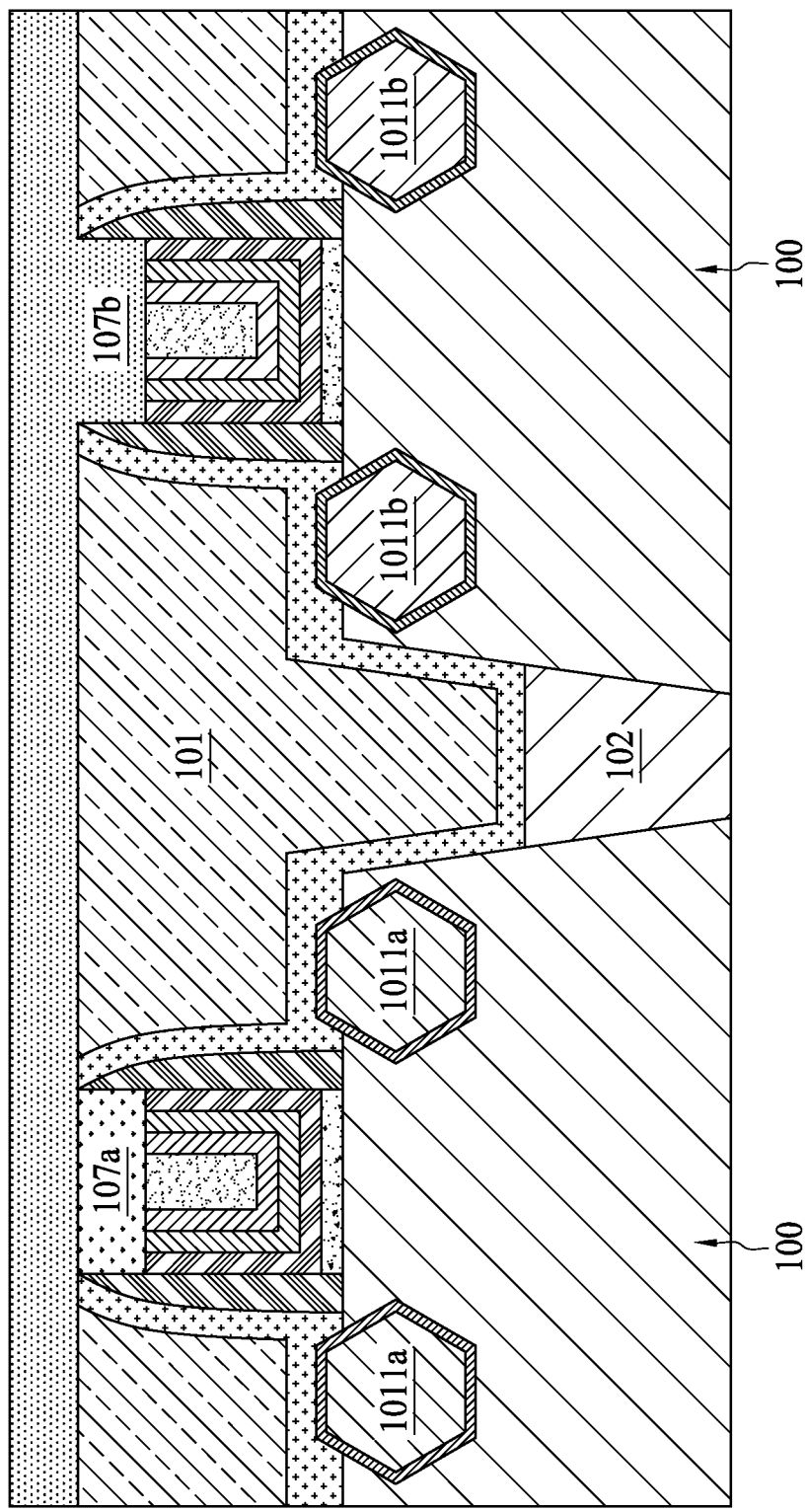
FIG. 16 is an operation of a semiconductor structure manufacturing method for metal gates and hard masks in accordance with some embodiments of the present disclosure.
Figure 17:
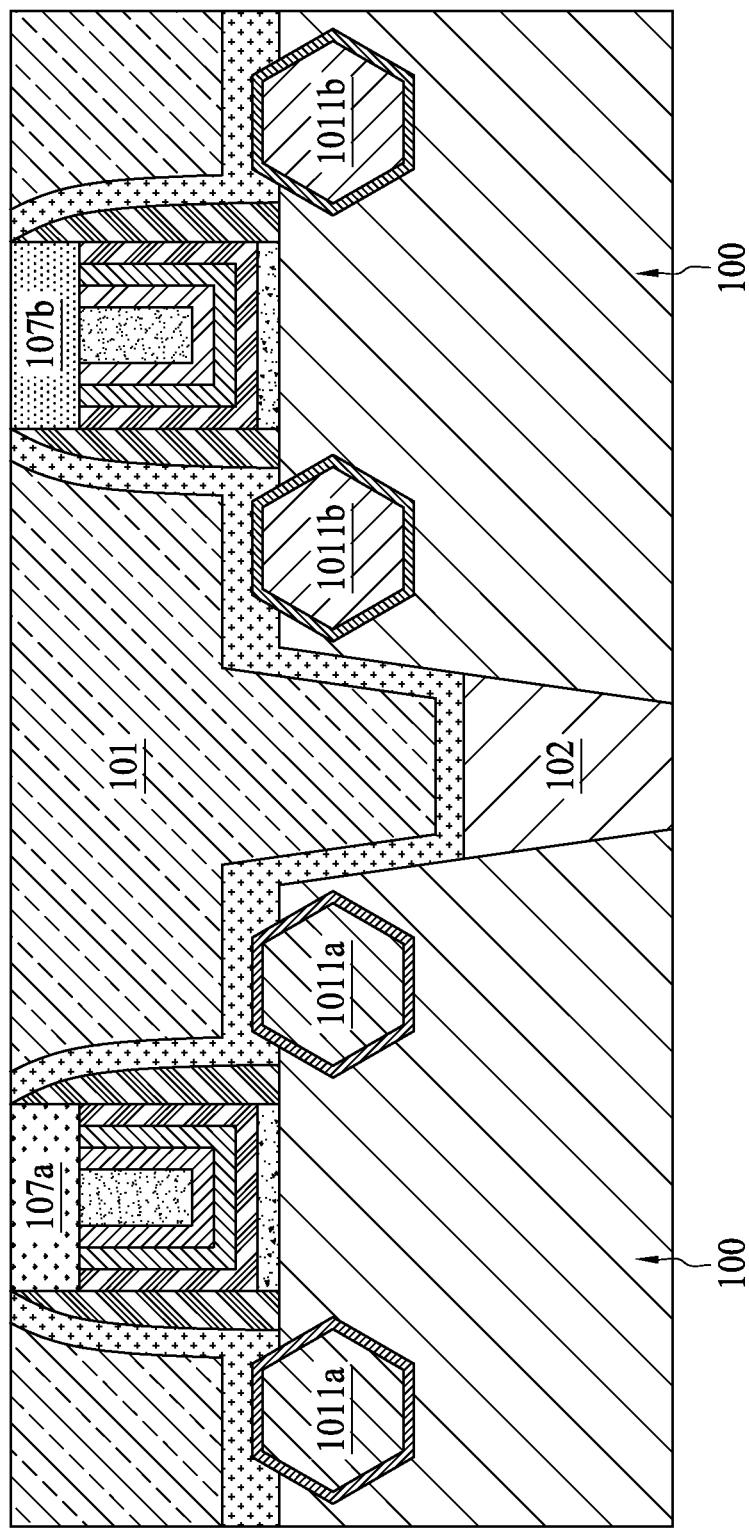
FIG. 17 is an operation of a semiconductor structure manufacturing method for metal gates and hard masks in accordance with some embodiments of the present disclosure.

FIG. 15-FIG. 17 show an operation of forming the second SAC hard mask on metal gate. In FIG. 15, the photoresist 905 is removed. In FIG. 16, a second SAC hard mask 107b is formed to blanket cover the metal gates and ILD 101. The excessive second SAC hard mask 107b is removed and only a portion is remained in the trench of the second metal gate as shown in FIG. 17.

Since the first SAC hard mask 107a and second hard mask 107b are separately formed, the properties of each hard mask can be independently controlled. A device designer can firstly decide what kind of stress is required to boost the performance of each device then determine which type SAC hard mask is adopted for a corresponding metal gate. In other words, a suitable SAC hard mask acts as a stress provider and can be selectively applied on a metal gate according to the designer's preference.

For example, in some embodiments a PECVD (plasma enhanced chemical vapor deposition) process is used to form the first SAC hard mask 107a. The PECVD process may have an RF power ranging from 200 Watt to 3000 Watt to form a silicon nitride film so as to introduce a tensile stress to the channel region underneath the first metal gate. For the second SAC hard mask 107b, HDP (high density plasma) process is used to form a film so as to introduce a compressive stress to the channel region underneath the second metal gate.

For some embodiments, the SAC hard mask can be extended to cover more areas of the metal gate. As in FIG. 18, the SAC hard mask is designed to cover a portion of spacers 1035a and 1035b. The increased coverage on metal gate provides more stress introduced into the channel region underneath the metal gate.

Figure 18:
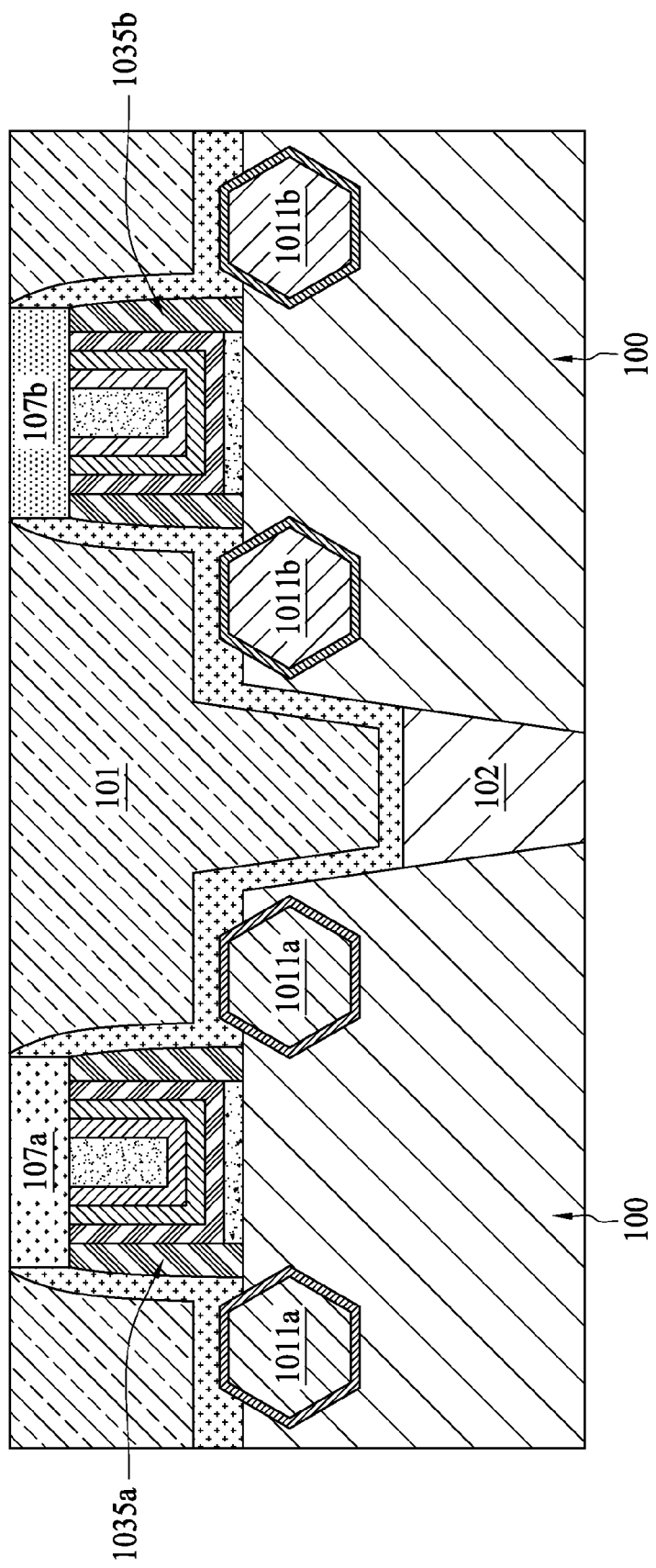
FIG. 18 is a cross sectional view of a semiconductor structure with metal gates and hard masks in accordance with some embodiments of the present disclosure.
Figure 19:
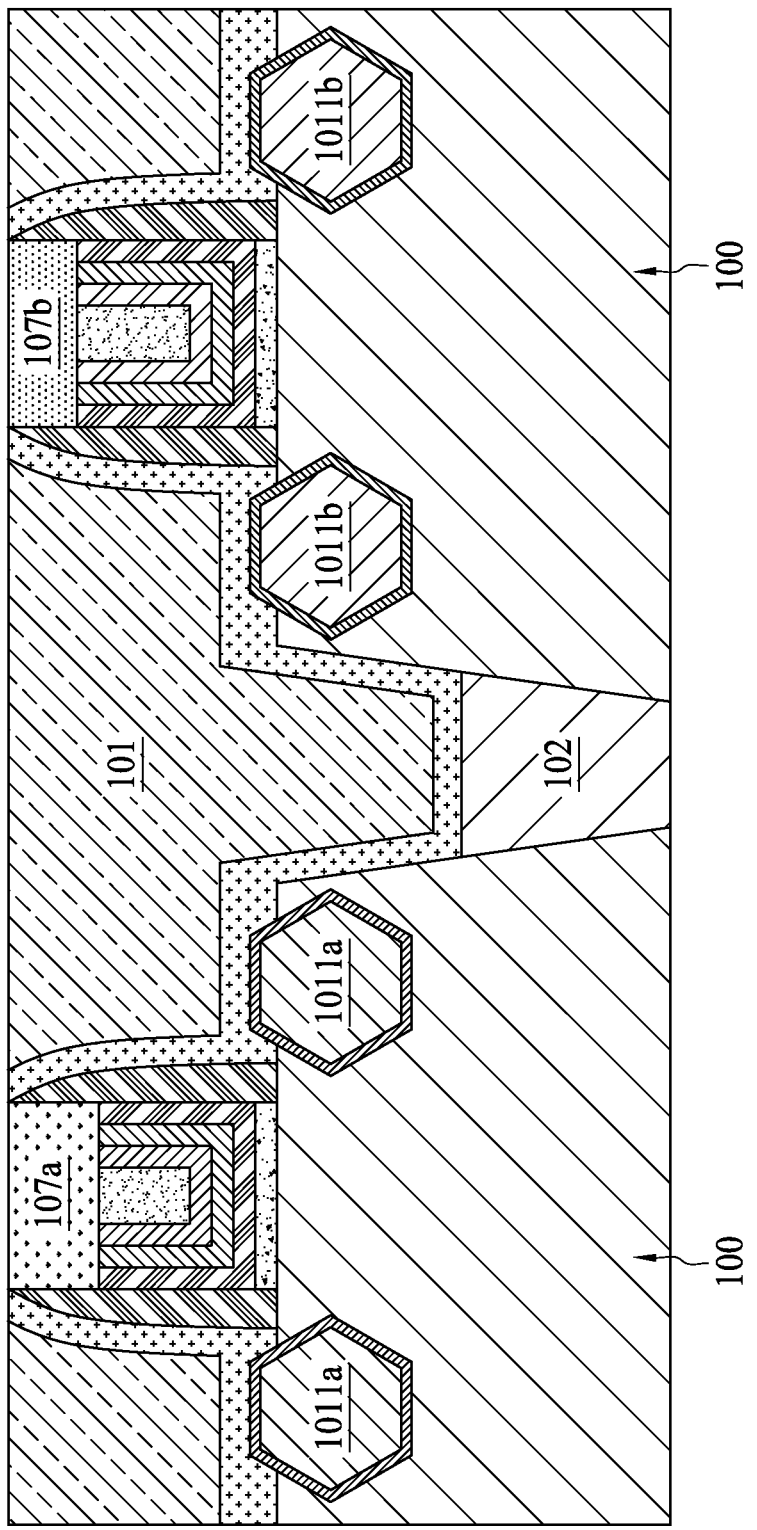
FIG. 19 is a cross sectional view of a semiconductor structure with metal gates and hard masks in accordance with some embodiments of the present disclosure.

To cover the portion of the spacers 1035a and 1035b with the SAC hard masks, a similar operation as in FIG. 10 is utilized to form a trench to expose a portion of spacers 1035a and 1035b. Thus, an extended SAC hard mask as in FIG. 18 is formed to cover the spacers 1035a and 1035b.

The trench (203a and 203b) formed in FIG. 10 can also be adjusted in order to have different depth between different metal gate so as to form SAC hard mask with different longitudinal height therebetween. For example, as in FIG. 19, the first SAC hard mask 107a is greater than the second SAC hard mask 107b. In some embodiments, the stress introduced into the channel region underneath the metal gate can be adjusted by the longitudinal height of the SAC hard mask.

Figure 20:
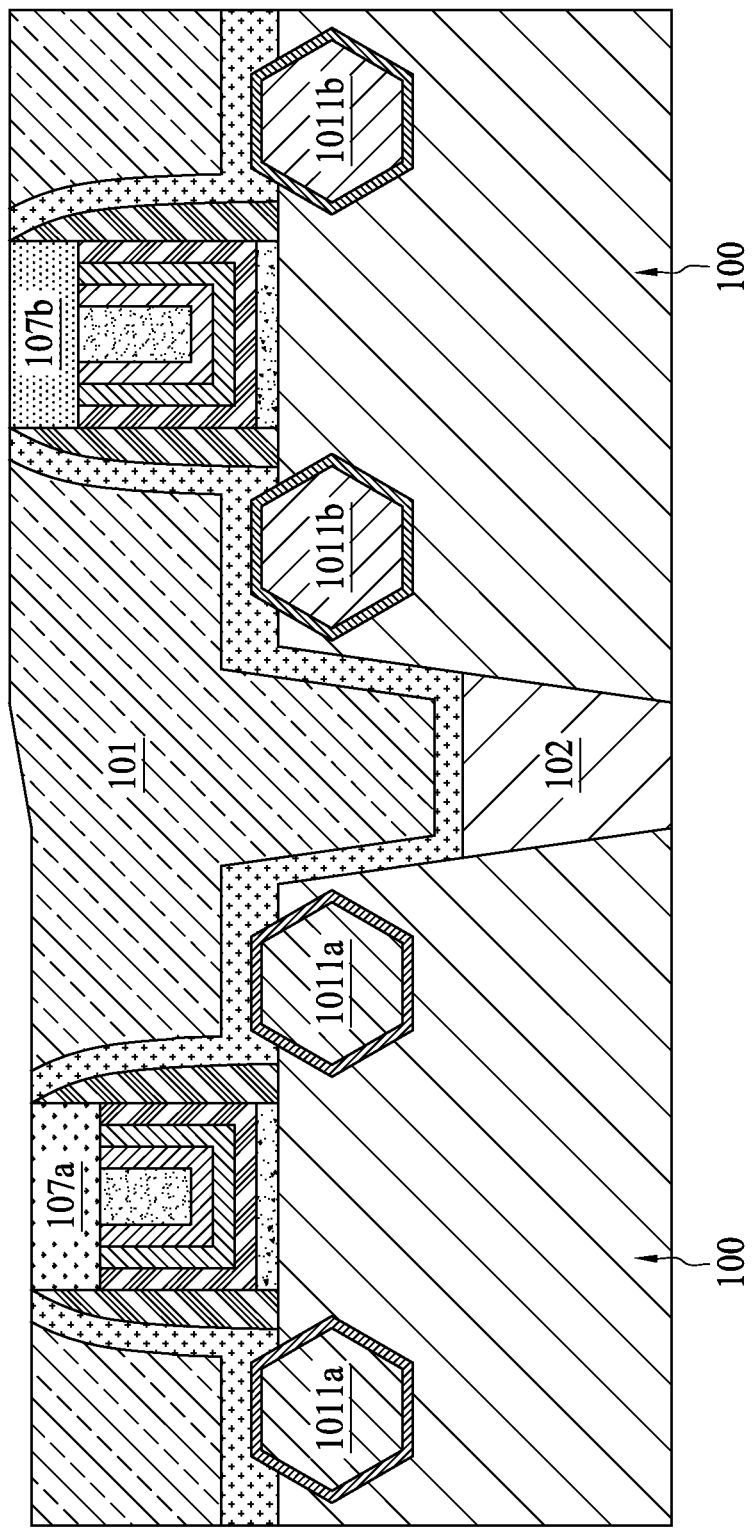
FIG. 20 is a cross sectional view of a semiconductor structure with metal gates and hard masks in accordance with some embodiments of the present disclosure.
Figure 21:
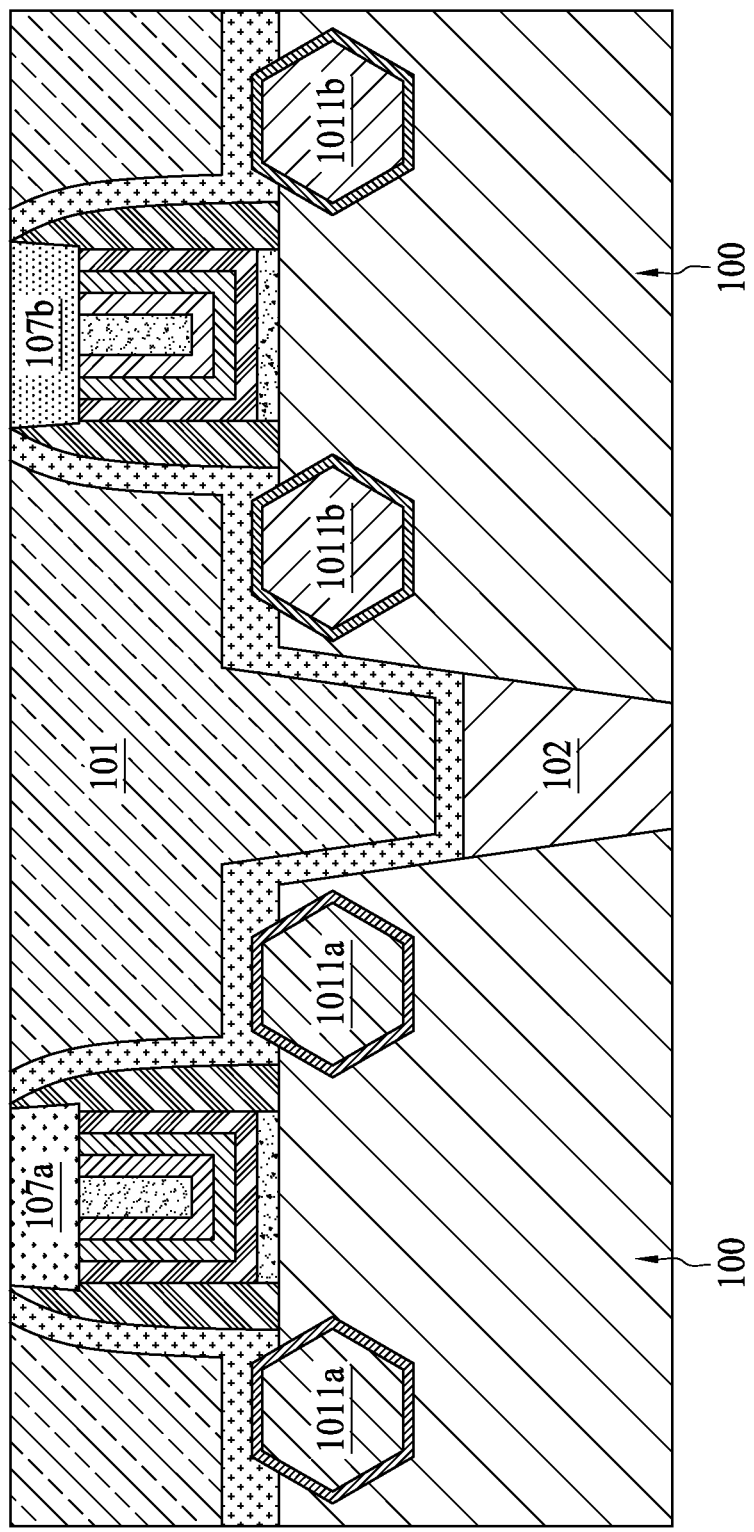
FIG. 21 is a cross sectional view of a semiconductor structure with metal gates and hard masks in accordance with some embodiments of the present disclosure.

Another alternative way to achieve a different longitudinal height for the first and second metal gate can be realized by CMP operation as in FIGS. 16-17, and selectively etch the desired metal gate. Therefore the selected metal gate has a lower longitudinal height than the unselected ones, as shown in FIG. 20.

Another way to adjust the stress for different channel regions underneath metal gates is to change the shape of the SAC hard mask. For some embodiments, as in FIG. 21, the SAC hard masks 107a and 107b are respectively formed in different shapes. A SAC hard mask with a laterally longer lower portion can have a tensile stress introducing to the channel region underneath metal gate, like the first SAC hard mask 107a shown in FIG. 21. A SAC hard mask with a laterally longer upper portion can have a compressive stress introducing to the channel region underneath metal gate, like the second SAC hard mask 107b shown in FIG. 21.

To achieve different shapes for two SAC hard masks, during the operation shown in FIG. 10, separate lateral sidewall etch can be designed to remove a spacer 1035a and 1035b in separate steps so as to have different trench shape between gates. Therefore, the subsequent SAC hard mask can be formed in different shapes between gates.

Figure 22:
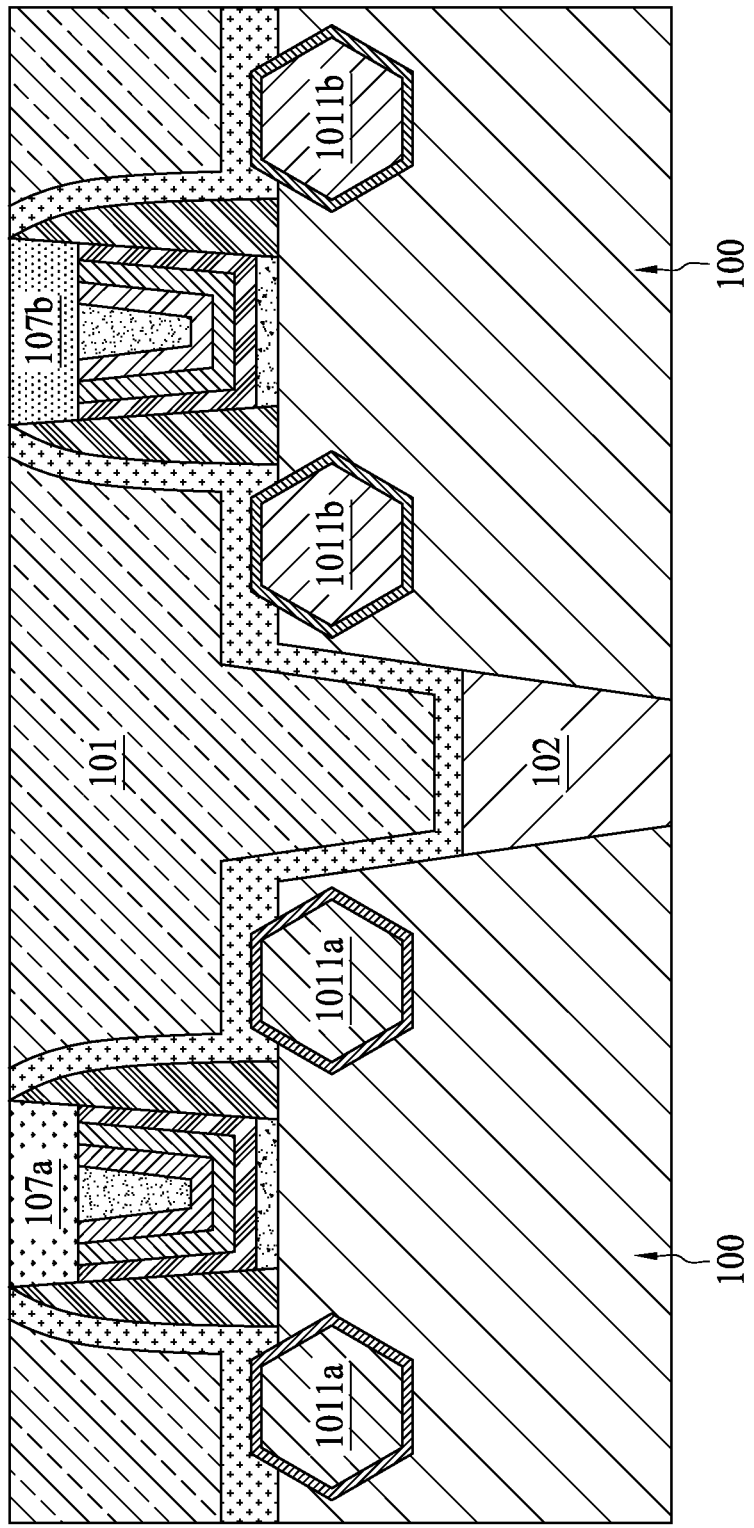
FIG. 22 is a cross sectional view of a semiconductor structure with metal gates and hard masks in accordance with some embodiments of the present disclosure.

For some embodiments, as in FIG. 22, the first and the second metal gate recess 203a and 203b (not shown in FIG. 22) both have a longer upper portion and renders subsequently formed metal gates and SAC hard masks possessing a laterally upper portion. For some cases, a SAC hard mask with a tapered shape as in FIG. 22 has a compressive stress introducing to the channel region underneath metal gate.

Figure 23:
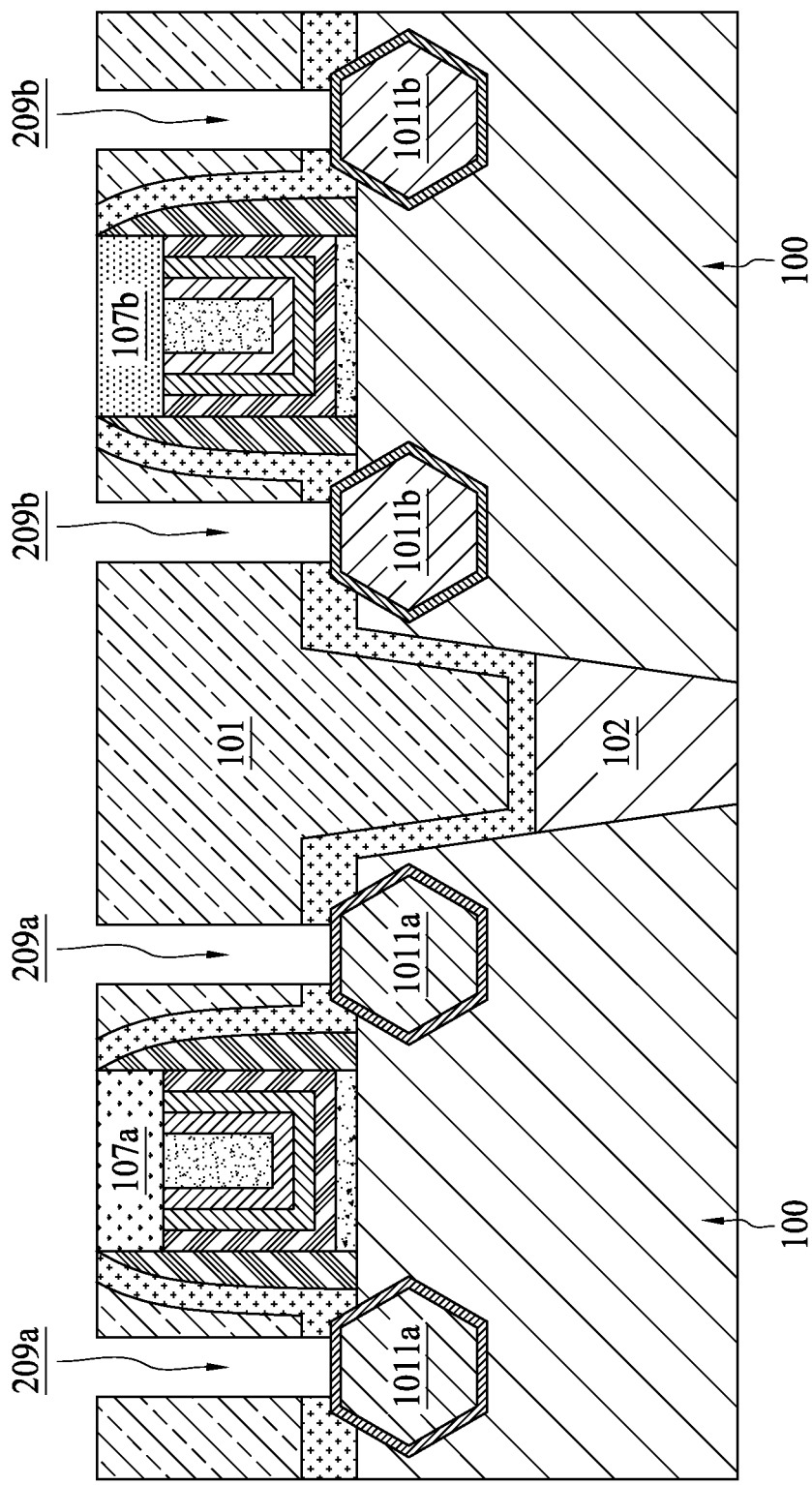
FIG. 23 is a cross sectional view of a semiconductor structure with metal gates, hard masks and contacts in accordance with some embodiments of the present disclosure.

In some embodiments, as shown in FIG. 23, contacts 209a and 209b are formed to expose the source/drain region 1011a and 1011b. An etchant used for etching the ILD 101 to expose the source/drain region 1011a and 1011b has a selective etch between the SAC hard masks and the ILD 101. In some embodiments, the SAC hard masks include nitride and the ILD 101 includes oxide.

In some embodiments, the source/drain regions 1011a and 1011b have a raised portion.

In some embodiments, at least one of the raised source/drain region 1011a and 1011 b is an epitaxial layer.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps.

In addition, each claim constitutes a separate embodiment, and the combination of various claims and embodiments are within the scope of the disclosure.

What is claimed is:

1. A semiconductor structure, comprising:
   a semiconductor substrate comprising a first and a second surface;
   an interlayer dielectric (ILD) with a first recess over the first surface of the semiconductor substrate and a second recess over the second surface of the semiconductor substrate;
   a first spacer lining a sidewall of the first recess, and a second spacer lining a sidewall of the second recess;
   a first high-k dielectric layer contacting a bottom of the first recess and a sidewall of the first spacer, and a second high-k dielectric layer contacting a bottom of the second recess and a sidewall of the second spacer;
   a first metal contacting bottom and sidewall of the first high-k dielectric layer, and a second metal contacting bottom and sidewall of the second high-k dielectric layer;
   wherein the first metal and the second metal are used for different conductive type semiconductor to each other; and
   a first SAC (Self-Aligned-Contact) hard mask on the first metal, and a second SAC hard mask on the second metal,
   wherein the first SAC hard mask introduces a tensile stress to an N type channel region underneath the first metal, and the second SAC hard mask with a laterally longer upper portion introducing a compressive stress to a P type a channel region underneath the second metal.

2. The semiconductor structure in claim 1, wherein the first SAC hard mask is on the first metal and the first spacer.

3. The semiconductor structure in claim 1, wherein the second SAC hard mask is on the second metal and the second spacer.

4. The semiconductor structure in claim 1, wherein the first SAC hard mask or the second SAC hard mask comprises nitride.

5. The semiconductor structure in claim 1, wherein longitudinal height of the first SAC hard mask and the second SAC hard mask are substantially different to each other.

6. The semiconductor structure in claim 1, wherein longitudinal height of the first metal and the second metal are different.

7. The semiconductor structure in claim 1, wherein the first SAC hard mask has an upper portion and a lower portion, a lateral length of the upper portion and the lower portion of the first SAC hard mask are different.

8. The semiconductor structure in claim 1, wherein the second SAC hard mask has an upper portion and a lower portion, a lateral length of the upper portion and the lower portion of the second SAC hard mask are different.

9. A semiconductor structure, comprising:
   a semiconductor substrate comprising a surface;
   an interlayer dielectric (ILD) with a recess over the surface of the semiconductor substrate;
   a first spacer lining a sidewall of the recess;
   a source/drain region in the semiconductor substrate, adjacent to a channel region under the recess;
   a high-k dielectric layer contacting a bottom of the recess and a sidewall of the spacer;
   a metal contacting bottom and sidewall of the high-k dielectric layer; and
   a SAC hard mask in the recess, wherein the SAC hard mask contacts the metal and the high-k dielectric layer, wherein the SAC hard mask has a tapered shape.

10. The semiconductor structure in claim 9, wherein a second spacer is sandwiched between the first spacer and the interlayer dielectric in longitudinal direction, and is sandwiched between the surface and the interlayer dielectric in lateral direction.

11. The semiconductor structure in claim 10, wherein the second spacer comprises nitride.

12. The semiconductor structure in claim 9, wherein the source/drain region is an epitaxial layer.

13. The semiconductor structure in claim 9, wherein the SAC hard mask comprises nitride and the interlayer dielectric comprises oxide.

14. The semiconductor structure in claim 9, wherein the recess tapers toward the bottom of the recess.

15. The semiconductor structure in claim 9, wherein the semiconductor structure is a FinFET structure.

16. A method for manufacturing a semiconductor structure, comprising:
   forming a first and a second recess in an interlayer dielectric (ILD);
   forming a first spacer lining a sidewall of the first recess and a second spacer lining a sidewall of the second recess;
   forming a first high-k dielectric layer contacting a bottom of the first recess and a sidewall of the first spacer;
   forming a first metal contacting bottom and sidewall of the first high-k dielectric layer;
   forming a second high-k dielectric layer contacting a bottom of the second recess and a sidewall of the second spacer;
   forming a second metal contacting bottom and sidewall of the second high-k dielectric layer; and
   forming a first SAC hard mask on the first metal;
   removing the first SAC hard mask on the second metal; and
   forming a second SAC hard mask on the second metal;
   wherein the first SAC hard mask and the second SAC hard mask have opposite stresses to channel regions underneath the first metal and the second metal.

17. The method in claim 16, further comprising etching back the first metal or the second metal.

18. The method in claim 16, further comprising:
   forming contact in the interlayer dielectric to expose the source/drain region by using an etchant,
   wherein the etchant has a selective etch between a nitride and an oxide.

19. The method in claim 16, further comprising determining the stress requirement for the first metal and the second metal.

* * * * *